US011204375B2

(12) United States Patent
Derviskadic et al.

(10) Patent No.: US 11,204,375 B2
(45) Date of Patent: Dec. 21, 2021

(54) METHOD FOR ESTIMATING SYNCHROPHASORS DURING STATIC AND DYNAMIC CONDITIONS

(71) Applicant: ECOLE POLYTECHNIQUE FEDERALE DE LAUSANNE (EPFL), Lausanne (CH)

(72) Inventors: Asja Derviskadic, Lausanne (CH); Paolo Romano, Lausanne (CH); Mario Paolone, La Conversion (CH)

(73) Assignee: ECOLE POLYTECHNIQUE FÉDÉRALE DE LAUSANNE (EPFL), Lausanne (CH)

( * ) Notice: Subject to any disclaimer, the term of this patent is extended or adjusted under 35 U.S.C. 154(b) by 57 days.

(21) Appl. No.: 16/620,585

(22) PCT Filed: Jun. 9, 2017

(86) PCT No.: PCT/IB2017/053414
§ 371 (c)(1),
(2) Date: Dec. 9, 2019

(87) PCT Pub. No.: WO2018/224866
PCT Pub. Date: Dec. 13, 2018

(65) Prior Publication Data
US 2020/0200806 A1 Jun. 25, 2020

(51) Int. Cl.
*G01R 19/25* (2006.01)
(52) U.S. Cl.
CPC ..... *G01R 19/2509* (2013.01); *G01R 19/2513* (2013.01)

(58) Field of Classification Search
CPC ............ G01R 19/2509; G01R 19/2513; G01R 19/2506; Y02E 60/00; Y02E 40/70; Y04S 10/22
See application file for complete search history.

(56) References Cited

U.S. PATENT DOCUMENTS 10,971,933 B2* 4/2021 Zweigle ................... H02J 3/24
2014/0343878 A1* 11/2014 Gudmundsson ... G01R 19/2513
702/64
2018/0348266 A1* 12/2018 Yao ..................... G01R 19/2513

OTHER PUBLICATIONS

Belega, "Accuracy Analysis of the Multicycle Synchrophasor Estimator Provided by the Interpolated DFT Algorithm", IEEE Transactions on Instrumentation and Measurement, vol. 62, 2013; pp. 942-950 (Year: 2013).*

(Continued)

*Primary Examiner* — Tarun Sinha
*Assistant Examiner* — Yossef Korang-Beheshti
(74) *Attorney, Agent, or Firm* — Nixon & Vanderhye P.C.

(57) ABSTRACT

A method for performing synchrophasor estimation of an input signal, whereby the input signal is a sinusoidal power system voltage or current signal, comprising: a. Periodic sampling of a continuous time-domain waveform, consisting of a power system voltage or current signal, to obtain a discrete time-domain function; b. Transforming a discrete time-domain function to a discrete frequency-domain function; c. Estimating from the discrete frequency-domain function the instantaneous parameters of a synchrophasor of the sampled continuous time-domain waveform, the instantaneous parameters comprising a frequency, an amplitude and a phase angle. The method is directed to an improvement of the enhanced IpDFT-based synchrophasor estimation which takes into account interharmonic tones.

11 Claims, 24 Drawing Sheets

(56) References Cited

OTHER PUBLICATIONS

Agrež, Dušan, "Weighted Multipoint Interpolated DFT to Improve Amplitude Estimation of Multifrequency Signal," IEEE Transactions on Instrumentation and Measurement, vol. 51, No. 2, Apr. 2002, pp. 287-292.

Belega, Daniel, et al., "Accuracy Analysis of the Multicycle Synchrophasor Estimator Provided by the Interpolated DFT Algorithm," IEEE Transactions on Instrumentation and Measurement, vol. 62, No. 5, May 2013, pp. 942-953.

Belega, Daniel, et al., "Frequency estimation of a sinusoidal signal via a three-point interpolated DFT method with high image component interference rejection capability," Digital Signal Processing 24, 2014, pp. 162-169.

Belega, Daniel, et al., "Sine-wave parameter estimation by interpolated DFT method based on new cosine windows with high interference rejection capability," Digital Signal Processing 33, 2014, pp. 60-70.

Belega, Daniel, et al., "Impact of harmonics on the interpolated DFT frequency estimator," Mechanical Systems and Signal Processing 66-67, 2016, pp. 349-360.

Bertocco, Matteo, et al., "Compressive Sensing of a Taylor-Fourier Multifrequency Model for Synchrophasor Estimation," IEEE Transactions on Instrumentation and Measurement, vol. 64, No. 12, Dec. 2015, pp. 3274-3283.

Castello, Paolo, et al., "Impact of the Model on the Accuracy of Synchrophasor Measurement," IEEE Transactions on Instrumentation and Measurement, vol. 61, No. 8, Aug. 2012, pp. 2179-2188.

Castello, Paolo, et al., "A Fast and Accurate PMU Algorithm for P+M Class Measurement of Synchrophasor and Frequency," IEEE Transactions on Instrumentation and Measurement, 2014, pp. 1-9.

Duda, Krzysztof, et al., "Interpolated DFT for $sin\alpha(x)$ Windows," IEEE Transactions on Instrumentation and Measurement, vol. 63, No. 4, Apr. 2014, pp. 754-760.

Ferrero, Alessandro, et al., "A Fast, Simplified Frequency-Domain Interpolation Method for the Evaluation of the Frequency and Amplitude of Spectral Components," IEEE Transactions on Instrumentation and Measurement, vol. 60, No. 5, May 2011, pp. 1579-1587.

Grandke, Thomas, "Interpolation Algorithms for Discrete Fourier Transforms of Weighted Signals," IEEE Transactions on Instrumentation and Measurement, vol. IM-32, No. 2, Jun. 1983, pp. 350-355.

Harris, Fredric J., "On the Use of Windows for Harmonic Analysis with the Discrete Fourier Transform," Proceedings of the IEEE, vol. 66, No. 1, Jan. 1978, pp. 51-83.

Jain, Vijay K., et al., "High-Accuracy Analog Measurements via Interpolated FFT," IEEE Transactions on Instrumentation and Measurement, vol. IM-28, No. 2, Jun. 1979, pp. 113-122.

Mach, David, et al., "Impact of Acquisition Wideband Noise on Synchrophasor Measurements: A Design Perspective," IEEE Transactions on Instrumentation and Measurement, vol. 65, No. 10, Oct. 2016, pp. 2244-2253.

Pignati, Marco, et al., "Fault Detection and Faulted Line Identification in Active Distribution Networks using Synchrophasors-based Real-Time State Estimation," IEEE Transactions on Power Delivery, 2015, pp. 1-11.

Radil, Tomáš, et al., "New Spectrum Leakage Correction Algorithm for Frequency Estimation of Power System Signals," IEEE Transactions on Instrumentation and Measurement, vol. 58, No. 5, May 2009, pp. 1670-1679.

Romano, Paolo, et al., "Enhanced Interpolated-DFT for Synchrophasor Estimation in FPGAs: Theory, Implementation, and Validation of a PMU Prototype," IEEE Transactions on Instrumentation and Measurement, vol. 63, No. 12, Dec. 2014, pp. 2824-2836.

Romano, Paolo, "DFT-based Synchrophasor Estimation Algorithms and their Integration in Advanced Phasor Measurement Units for the Real-time Monitoring of Active Distribution Networks," Thesis No. 6906, 2016, 183 pages.

Roscoe, Andrew J., "Exploring the Relative Performance of Frequency-Tracking and Fixed-Filter Phasor Measurement Unit Algorithms Under C37.118 Test Procedures, the Effects of Interharmonics, and Initial Attempts at Merging P-Class Response With M-Class Filtering," IEEE Transactions on Instrumentation and Measurement, vol. 62, No. 8, Aug. 2013, pp. 2140-2153.

"IEEE Standard for Synchrophasor Measurements for Power Systems," IEEE Standards Association, IEEE Power & Energy Society, IEEE Std C37.118.1™-2011, 61 pages.

"IEEE Guide for Synchronization, Calibration, Testing, and Installation of Phasor Measurement Units (PMUs) for Power System Protection and Conlrol," IEEE Standards Association, IEEE Power & Energy Society, IEEE Std C37.242™-2013, 107 pages.

"IEEE Standard for Synchrophasor Measurements for Power Systems, Amendment 1: Modification of Selected Performance Requirements," IEEE Standards Association, IEEE Power & Energy Society, IEEE Std C37.118.1a™-2014, 25 pages.

Daniel Belega, et al., "Fast Synchrophasor Estimation by Means of Frequency-Domain and Time-Domain Algorithms", IEEE Transactions on Instrumentation and Measurement, IEEE Service Center, vol. 63, No. 2, Feb. 1, 2014, pp. 388-401.

Hsiung Cheng Lin, "Separation of adjacent interharmonics using maximum energy retrieving algorithm", IET Science, Measurement & Technology, The Institution of Engineering and Technology, vol. 10, Iss. 2, Mar. 1, 2016, pp. 92-99.

Yanchi Liu, et al., "Resolution-Enhanced Harmonic and Interharmonic Measurement for Power Quality Analysis in Cyber-Physical Energy System", Sensors, vol. 16, No. 7, Jun. 27, 2016, 21 pages.

Tomáš Radil, et al., "New Spectrum Leakage Correction Algorithm for Frequency Estimation of Power System Signals", IEEE Transactions on Instrumentation and Measurement, IEEE Service Center, vol. 58, No. 5, May 1, 2009, pp. 1670-1679.

Paolo Romano, et al., "Enhanced Interpolated-DFT for Synchrophasor Estimation in FPGAs: Theory, Implementation, and Validation of a PMU Prototype", IEEE Transactions on Instrumentation and Measurement, IEEE Service Center, vol. 63, No. 12, Dec. 1, 2014, pp. 2824-2836.

International Search Report for PCT/IB2017/053414 dated Feb. 9, 2018, 4 pages.

Written Opinion of the ISA for PCT/IB2017/053414 dated Feb. 9, 2018, 7 pages.

\* cited by examiner

Algorithm 1: The e-IpDFT algorithm.

1:     $X(k) = \text{DFT}(x(n))$

2:     $\{\hat{f}_0^0, \hat{A}_0^0, \hat{\varphi}_0^0\} = \text{IpDFT}(X(k))$

3:     for $p = 1 \to P$

4:         $\hat{X}_0^{p-}(k) = \text{wf}(-\hat{f}_0^{p-1}, \hat{A}_0^{p-1}, -\hat{\varphi}_0^{p-1})$ 5:         $\hat{X}_0^{p+}(k) = X(k) - \hat{X}_0^{p-}(k)$ 6:         $\{\hat{f}_0^p, \hat{A}_0^p, \hat{\varphi}_0^p\} = \text{IpDFT}(\hat{X}_0^{p+}(k))$ 7:     end for

*Fig. 7*

Algorithm 2: The i-IpDFT algorithm.

1:      $X(k) = \text{DFT}(x(n))$

2:      $\{\hat{f}_0^0, \hat{A}_0^0, \hat{\varphi}_0^0\}|_P = \text{e-IpDFT}[X(k)]$ 3:      $\hat{X}_0^0(k) = \text{wf}(\hat{f}_0^0, \hat{A}_0^0, \hat{\varphi}_0^0) + \text{wf}(-\hat{f}_0^0, \hat{A}_0^0, -\hat{\varphi}_0^0)$ 4:      if $\sum |X(k) - \hat{X}_0^0(k)|^2 > \lambda \cdot \sum |X(k)|^2$ 5:          for $q = 1 \to Q$ 6:              $\{\hat{f}_i^q, \hat{A}_i^q, \hat{\varphi}_i^q\}|_P = \text{e-IpDFT}[X(k) - \hat{X}_0^{q-1}(k)]$ 7:              $\hat{X}_i^q(k) = \text{wf}(\hat{f}_i^q, \hat{A}_i^q, \hat{\varphi}_i^q) + \text{wf}(-\hat{f}_i^q, \hat{A}_i^q, -\hat{\varphi}_i^q)$ 8:              $\{\hat{f}_0^q, \hat{A}_0^q, \hat{\varphi}_0^q\}|_P = \text{e-IpDFT}[X(k) - \hat{X}_i^q(k)]$ 9:              $\hat{X}_0^q(k) = \text{wf}(\hat{f}_0^q, \hat{A}_0^q, \hat{\varphi}_0^q) + \text{wf}(-\hat{f}_0^q, \hat{A}_0^q, -\hat{\varphi}_0^q)$ 10:         end for

11:    else

12:         break

13:    end if

| Parameter | Variable | Value |
|---|---|---|
| Nominal system frequency | $f_n$ | 50 Hz |
| Window length | $T$ | 60 ms $(3/f_n)$ |
| Sampling rate | $F_s$ | 50 kHz |
| PMU reporting rate | $F_r$ | 50 fps |
| DFT bins | $K$ | 11 |
| Iterations comp. of the image | $P$ | 2 |
| Iterations overall procedure | $Q$ | 16 (cos), 28 (Hann) |
| IpDFT interpolation points | - | 3 |

Fig. 23

| | | IEEE Std TVE [%] | | | | IEEE Std FE [Hz] | | | | IEEE Std RFE [Hz/s] | | |
|---|---|---|---|---|---|---|---|---|---|---|---|---|
| | P | M | cos | i-bpDFT Hann | P | M | cos | i-bpDFT Hann | P | M | cos | i-bpDFT Hann |
| Sign Freq | 1 | 1 | 2.4E-3 | 3.1E-3 | 0.005 | 0.005 | 1.2E-4 | 1.4E-4 | 0.4 | 0.1 | 1.1E-2 | 1.3E-2 |
| Harm Dist 1% | 1 | 1 | 9.4E-2 | 2.6E-3 | 0.005 | 0.005 | 4.7E-3 | 1.2E-4 | 0.4 | - | 8.3E-3 | 1.2E-2 |
| Harm Dist 10% | 1 | 1 | 4.7E-2 | 2.6E-3 | 0.005 | 0.005 | 1.1E-3 | 1.2E-4 | 0.4 | - | 9.4E-3 | 1.1E-2 |
| OOBI $f_0$=47.5 Hz | - | 1.3 | 2.1E-2 | 6.2E-3 | - | 0.01 | 1.1E-3 | 4.1E-3 | - | - | 1.0E-1 | 3.7E-3 |
| $f_0$=50 Hz | - | 1.3 | 2.5E-3 | 3.7E-3 | - | 0.01 | 1.5E-3 | 2.0E-3 | - | - | 1.0E-2 | 1.3E-2 |
| $f_0$=52.5 Hz | - | 1.3 | 4.3E-3 | 1.1E-2 | - | 0.01 | 2.0E-3 | 5.9E-3 | - | - | 1.9E-2 | 3.2E-2 |

*Fig. 24*

METHOD FOR ESTIMATING SYNCHROPHASORS DURING STATIC AND DYNAMIC CONDITIONS

CROSS-REFERENCE TO RELATED APPLICATIONS

The present application is a United States national stage application of International patent application PCT/IB2017/053414 filed on Jun. 9, 2017 designating the United States, the content of this document being herewith incorporated by reference in its entirety.

TECHNICAL FIELD

The present invention relates generally to the field of signal analysis, and more specifically, to a synchrophasor estimation method characterized by a high level of accuracy and a fast response time, designed to analyze typical power grid operating conditions, including the case of signals corrupted by interharmonics, by means of Phasor Measurement Units (PMUs).

I. Description of the Related Art

Phasor Measurement Units (PMUs) are devices that produce synchronized phasor, frequency and Rate-of-Change-of-Frequency (ROCOF) estimates from voltage and/or current signals and a time synchronizing signal. A phasor calculated from data samples using a standard synchronizing time signal as the reference for the measurement is called synchrophasor. PMUs typically embed (see FIG. 1):

a) a time-synchronization unit, capable of providing a sub-microsecond accurate UTC time reference (Coordinated Universal Time—UTC—defined as the time of day at the Earth's prime meridian, 0° longitude) using any of the available time dissemination techniques (e.g., GPS, IRIG-B, PTP, etc.);

b) an analog-to-digital converter (ADC) that simultaneously samples each input channel, synchronously with respect to the UTC time-reference;

c) one or more processing units implementing the logic to estimate the synchrophasors;

d) a network interface that streams out the measured quantities at a reporting rate up to 60 estimations per second.

PMUs constitute the backbone of wide area monitoring, protection and control systems of modern power grids and provide a tool for system operators and planners to manage a power grid during both normal and fault conditions. PMUs are typically organized in synchrophasor networks (see FIG. 2) comprising a set of PMUs installed in multiple points of an electrical grid that transmit the measured quantities to a Phasor Data Concentrator (PDC). In high voltage transmission networks PMUs are already used, among others, to ensure the system stability, estimate the system state, monitor inter-area oscillations, analyse events, identify and locate fault events. However, PMUs might represent fundamental monitoring tools even in the context of distribution networks for applications such as real-time state estimation, loss of main, fault location and management, synchronous islanded operation and power quality monitoring.

The synchrophasor estimation (SE) algorithm of a Phasor Measurement Unit (PMU) must be designed depending on the supplied power grid application [1]. Indeed, PMUs expected to supply protection applications must be characterized by fast response times, whereas PMUs expected to supply monitoring applications must be characterized by highly accurate measurements and resiliency against interfering spectral components. To be more specific, a PMU meant to produce precise measures must be capable to reject interharmonics close to the 50 or 60 Hz main tone [1]. These are defined as signals characterized by an amplitude that is 10% of the main tone and a frequency $f_i$ in the bands [10, $f_n-F_r/2$] and [$f_n+F_r/2, 2f_n$], being $f_n$ the nominal power system frequency, $F_r$ the PMU reporting rate and $f_i/f_n \notin \mathbb{N}$ [1].

Recently, the idea of a single PMU capable of satisfying high accuracy and fast response time at the same time has become increasingly popular [2], [3]. The advantages are evident: from a cost perspective, an electrical utility interested to use PMUs to simultaneously supply monitoring and protection functionalities of situational awareness systems does not need to equip every measurement point with two different devices. From a measurement reliability perspective, the performance of fault management systems using PMU data to tune or back-up existing protection schemes, are not degraded by the presence of interharmonic tones [4].

In this respect, [3] proposes a hybrid PMU design based on tunable trigger thresholds to switch between two different frequency-tracking filters. The technique self-switches from a highly accurate algorithm to a fast response one in case a transient event is detected. Similarly, [4] presents and experimentally validates a SE process that implements in parallel two different Taylor Fourier Transform algorithms: the first one produces accurate measurements of steady state signals, while the second one is better suited to follow fast signal changes. In this case, the selection of the most appropriate algorithm is implemented by a detector that identifies the presence of power system transients.

Nevertheless, both approaches lack of a single design of the SE algorithm capable of satisfying both static and dynamic performance requirements. Consequently, the reliability of both approaches is based on the robustness of the adopted switching logic.

Among possible SE techniques, the interpolated discrete Fourier transform (IpDFT) has been widely used, in view of the optimal tradeoff between SE accuracy, response time and computational complexity [5] [9]. The IpDFT enables us to extract the parameters of a sinusoidal waveform by processing the highest DFT bins of the related DFT spectrum. However, the IpDFT results can be significantly corrupted by the spectral interference produced by the negative image of the fundamental tone of the signal or by eventual interfering tones. To cope with such phenomena, several IpDFT-based approaches proposed by the current literature rely on the possibility to compensate for the effects of the spectral interference produced by the negative image component of the fundamental tone [5][9]. Non-IpDFT-based methods have been investigated too, such as sine-fitting techniques [10], compressive sensing [11] and lookup tables [12].

In this regard, in [6] the formulation of an enhanced IpDFT-based SE algorithm that iteratively compensates the effects of the spectral interference produced by the negative image of the main spectrum tone is presented. However, the method presented in [6] does not account for the spectral interference produced by tones other than the fundamental one. As a consequence, it produces incorrect results in presence of interfering tones that are relatively close to the main one. In this respect, in [13] an IpDFT-based method that compensates the spectral interference generated by both the image component of the main tone and harmonic tones is presented. Although the technique proposed in [13] takes into account tones other than the fundamental one, such investigation disregards interharmonic tones.

Thus, there exists a substantial need for a single SE technique capable of accurately estimating the synchrophasors with a fast response time, even when analyzing signals corrupted by interharmonic tones close to the fundamental one.

II. Summary of the Invention

In a first aspect the invention provides a method for performing synchrophasor estimation of an input signal, whereby the input signal is a sinusoidal power system voltage or current signal, comprising:
  a. Periodic sampling of a continuous time-domain waveform, consisting of a power system voltage or current signal, to obtain a discrete time-domain function;
  b. Transforming a discrete time-domain function to a discrete frequency-domain function;
  c. Estimating from the discrete frequency-domain function the instantaneous parameters of a synchrophasor of the sampled continuous time-domain waveform, the instantaneous parameters comprising a frequency, an amplitude and a phase angle.

In a preferred embodiment, said periodic sampling, comprises:
  d. Acquiring a time-domain signal corresponding to the continuous time-domain waveform;
  e. Periodically sampling the time-domain signal with a specific sampling rate $F_s$, to obtain the discrete time-domain function.

In a further preferred embodiment, said transforming the discrete time-domain function to the discrete frequency-domain function, comprises:
  f. Extracting a finite-length portion of the discrete time-domain function, comprising N equally spaced samples;
  g. Applying to the extracted finite-length sequence of N samples a discrete time-domain window function to obtain a windowed signal;
  h. Applying a discrete time Fourier transform (DFT) to the windowed signal resulting in a frequency-domain function, to obtain the DFT spectrum.

In a further preferred embodiment, said estimating the instantaneous parameters of a synchrophasor comprises:
  i. Estimating the parameters of the main tone of the input signal by processing the DFT spectrum via the enhanced Interpolated DFT (e-IpDFT);
  j. Subtracting a main tone from the original DFT spectrum, to obtain a further DFT spectrum that accounts for any spurious contribution perturbing a fundamental tone of the input signal;

the method further comprising
  k. Comparing the spectral energy of the further DFT spectrum weighted by the spectral energy of the original DFT spectrum to a specific threshold,
  l. Detecting an interfering tone if the comparing reveals that the specific threshold is exceeded, and further applying following steps:
    i. Subtracting the main tone from the original DFT spectrum, to obtain an estimation of the DFT spectrum of the interfering tone of the input signal;
    ii. Estimating the parameters of the interfering tone of the input signal by processing the interfering tone DFT spectrum via e-IpDFT;
    iii. Subtracting the interfering tone from the original DFT spectrum, to obtain an estimation of the DFT spectrum of the main tone of the input signal;
    iv. Estimating the parameters of the main tone of the input signal by processing the main tone DFT spectrum via the e-IpDFT;
    v. Iterating steps i. to iv. a predefined number of times Q;
    vi. Reporting the parameters of the main tone of the input signal estimated at step iv.
  m. In case the interfering tone is not detected, reporting the estimated parameters of the main tone of the input signal.

In a further preferred embodiment, the enhanced Interpolated DFT (e-IpDFT), comprises:
  n. Estimating the parameters of the main tone of the input signal by processing the DFT spectrum via the Interpolated DFT (IpDFT);
  o. Subtracting the negative image of the main tone from the DFT spectrum, to obtain the spectrum of the positive image of the main tone;
  p. Estimating the parameters of the main tone of the input signal by processing the spectrum of the positive image of the main tone via the IpDFT;
  q. Iterating steps o. and p. a predefined number of times P;
  r. Reporting the parameters of the main tone of the input signal estimated at step q.

In a further preferred embodiment, said synchrophasor comprises a complex function characterized by an instantaneous frequency, amplitude and phase corresponding to the instantaneous frequency, amplitude and phase of the main tone of the input signal, referred to a common time reference.

In a second aspect, the invention provides a system for performing synchrophasor measurement comprising:
  s. A set of input channels to acquire voltage and/or current signals of a power system;
  t. A set of analog-to-digital-converters (ADCs), connected to the input channels, converting the analog signals to discrete-time equivalents;
  u. For each analog-to digital converter, one or more processing elements coupled to the analog-to-digital-converter, wherein the one or more processing elements are configured to:
    i. Receive a set of N equally spaced samples of the discrete time signals;
    ii. Apply a discrete time-domain window function to the finite-length signal;
    iii. Apply the discrete time Fourier transform (DFT) to the windowed signal;
    iv. Estimate the main/interfering tone parameters using e-IpDFT technique;
    v. Compensate the original DFT spectrum for any estimated tone;
    vi. Determine instantaneous frequency, amplitude and phase of the input signals using the estimate main tone parameters.

In a further preferred embodiment, the one or more processing elements comprise a programmable hardware element and/or circuitry.

In a further preferred embodiment, the one or more processing elements comprise a processor and memory.

BRIEF DESCRIPTION OF THE DRAWINGS

The invention will be better understood though the detailed description of preferred embodiments and in reference to the drawings, wherein

FIG. 7 contains a pseudo-code of the e-IpDFT (Algorithm 1)t;

FIG. 10 contains a pseudo-code of the i-IpDFT (Algorithm 2) according to the invention;

FIG. 22 contains i-IpDFT parameters;

FIG. 23 relates to compliance with respect to static signals: maximum TVE, FE and RFE for the i-IpDFT and maximum limit allowed by [1]; and FIG. 24 relates to compliance with respect to dynamic signals: maximum TVE, FE and RFE for the i-IpDFT and maximum limit allowed by [1].

DETAILED DESCRIPTION OF PREFERRED EMBODIMENTS OF THE INVENTION

Figure 1:
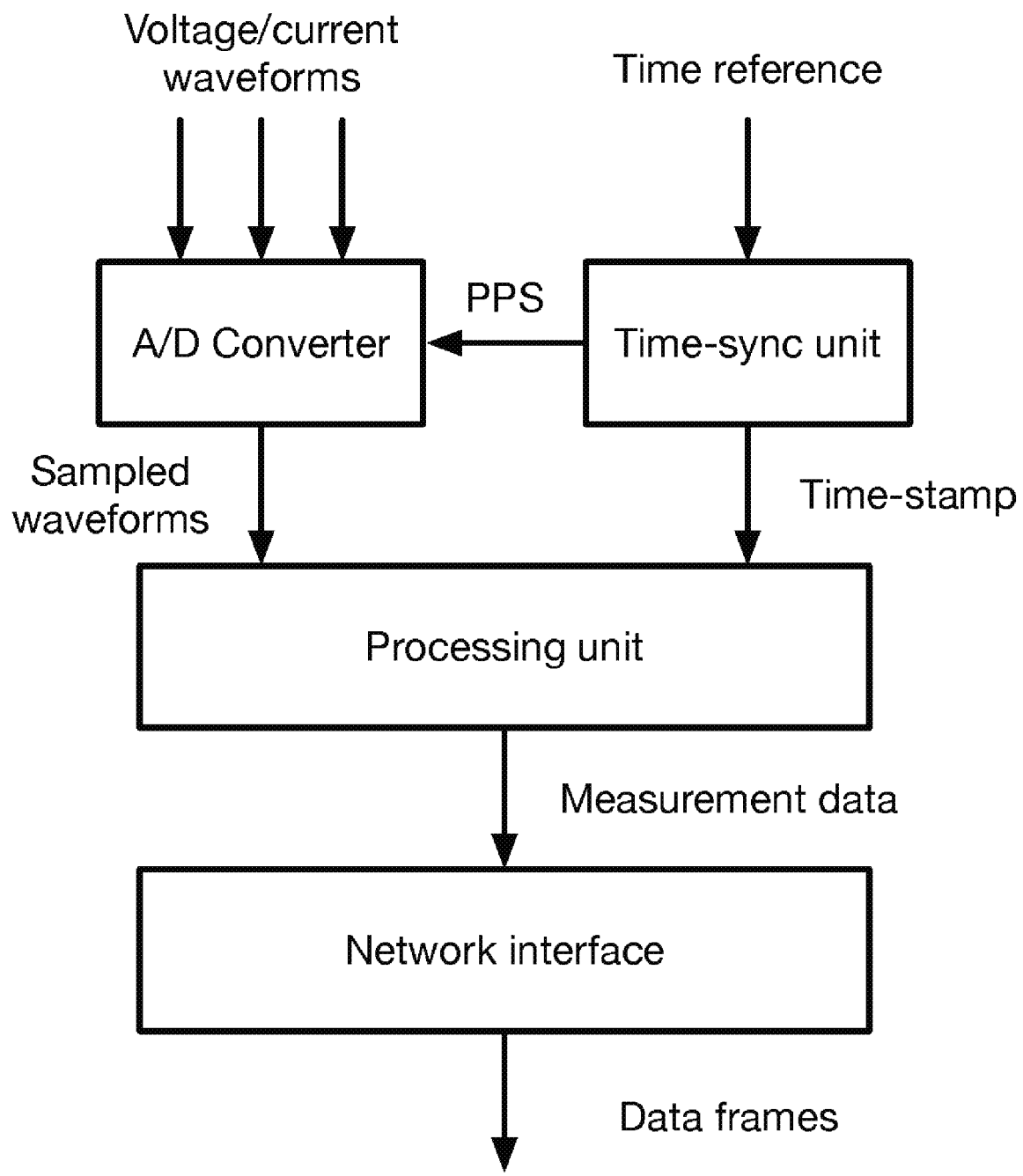
FIG. 1 shows a block scheme of a generic Phasor Measurement unit according to prior art.
Figure 2:
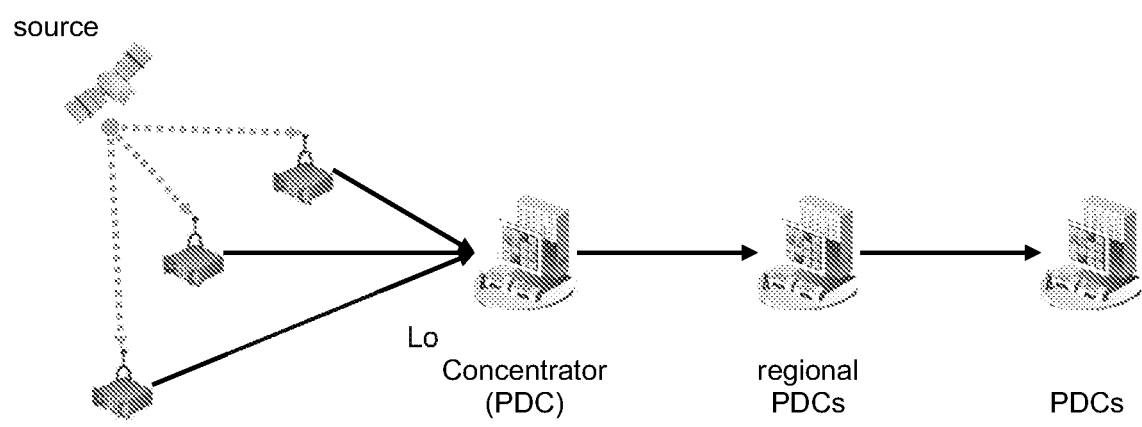
FIG. 2 shows a synchrophasor network according to prior art.
Figure 3:
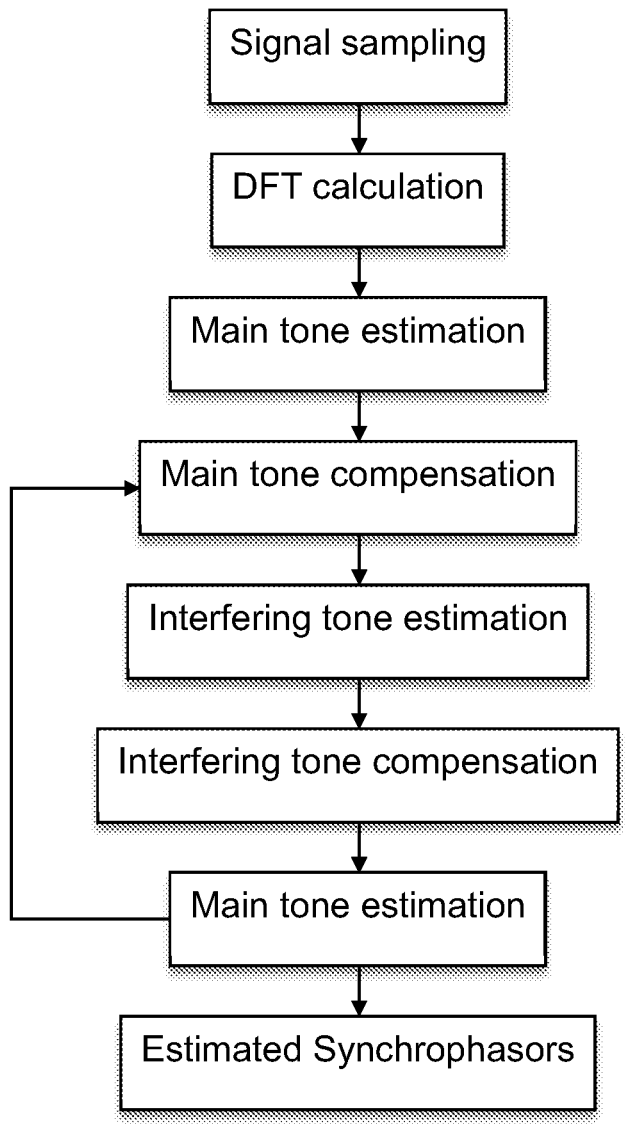
FIG. 3 contains a flowchart of the i-IpDFT method.

The invention concerns a synchrophasor estimation method characterized by a high level of accuracy and a fast response time, designed to analyze typical power grid operating conditions including the case of signals corrupted by interharmonics. The method is meant for Phasor Measurement Units (PMUs) expected to supply simultaneously protection applications, requiring fast response times, and measurement applications, requiring high accuracy and resiliency against interfering spectral components. The method, called iterative-Interpolated DFT (i-IpDFT), iteratively estimates and compensates the effects of the spectral interference produced by both a generic interfering tone, harmonic or interharmonic, and the negative image of the fundamental tone. The i-IpDFT technique applies for any number of IpDFT interpolation points, windowing function, window length and sampling frequency. The 3-points i-Ip-DFT technique for cosine and Hanning window functions is analytically presented. A procedure to select the i-IpDFT parameters is included. The performance of the i-IpDFT method is assessed with respect to all the static and dynamic operating conditions defined in the current IEEE Std. C37.118 for PMUs.

The present invention proposes a single SE method characterized by a high level of accuracy and a fast response time, designed to estimate the synchrophasors in typical power grid operating conditions, including the case of signals corrupted by interharmonics close to the main tone.

The method is meant for PMUs specifically designed to supply simultaneously protection applications, requiring fast response times, and measurement applications, requiring high accuracy and resiliency against interfering spectral components.

The technique is hereafter called iterative Interpolated Discrete Fourier Transform (i-IpDFT) and demonstrates how it is possible to develop a DFT-based SE algorithm capable of rejecting interharmonics, also when adopting relatively short window lengths (3 periods of a signal at $f_n$). The i-IpDFT method, that represents an evolution of the one presented in [6], iteratively finds and compensates the effects of the spectral interference produced by both an interfering tone, harmonic or interharmonic, and the negative image of the fundamental tone. The i-IpDFT algorithm can be formulated for any window function, number of IpDFT interpolation points, window length and sampling frequency. In what follows, the i-IpDFT algorithm is analytically formulated for a 3-points IpDFT for the family of $\cos^v$ window functions, with a particular focus on the cosine and the Hanning (or Hann) window, selected in view of their peculiar characteristics.

The main noticeable advantage of the i-IpDFT algorithm when comparing it with the method presented in [6] and other SE techniques, is that it is capable of correctly estimating the synchrophasors in all typical power system operating conditions without being characterized by a slow response time, even in presence of an interharmonic tone. More specifically, it satisfies all the accuracy requirements defined in the current standard for PMUs, the IEEE Std. C37.118 [1], for both dynamic and static operating conditions, for both M and P performance class PMUs as defined by the IEEE Std. 37.118 [1].

Within this context, Section III reviews the theoretical background about the IpDFT for $\cos^\alpha$ windows and presents the effects of spectral leakage on the IpDFT performance. Section IV formulates the i-IpDFT SE technique, with a specific focus on the selection of the algorithm parameters. Section V assess the algorithm performance in an offline simulation environment with respect to the all the static and dynamic testing conditions defined in the IEEE Std. C37.118 [1]. The results are presented in the case of a power system operating at a nominal frequency of 50 Hz, a reporting frequency of 50 fps and signals characterized by an SNR of 80 dB.

III. Interpolated DFT for $\cos^\alpha$ Windows

The IpDFT is a technique that enables us to extract the parameters of a sinusoidal waveform by processing the highest DFT bins of the related DFT spectrum. In particular, the IpDFT enables us to mitigate the effects generated by incoherent sampling by [14], [15]:

Applying suitably shaped window functions to reduce the spectral leakage effects;

Interpolating the highest DFT bins of the spectrum to minimize the spectral sampling effects.

In the following of this Section we present the IpDFT technique and define the nomenclature. More specifically, in Section III.A we introduce the family of $\cos^\alpha$ window functions with a particular focus on the cosine and the Hanning (or Hann) window. These two window types have been selected as they represent a good trade-off between the main-lobe width and the side-lobe levels. In Section III.B we derive the IpDFT solution for these window functions. Finally, in Section III.C we discuss the effects of spectral leakage on the IpDFT performance.

A. $\cos^\alpha$ Window Functions

Figure 4:
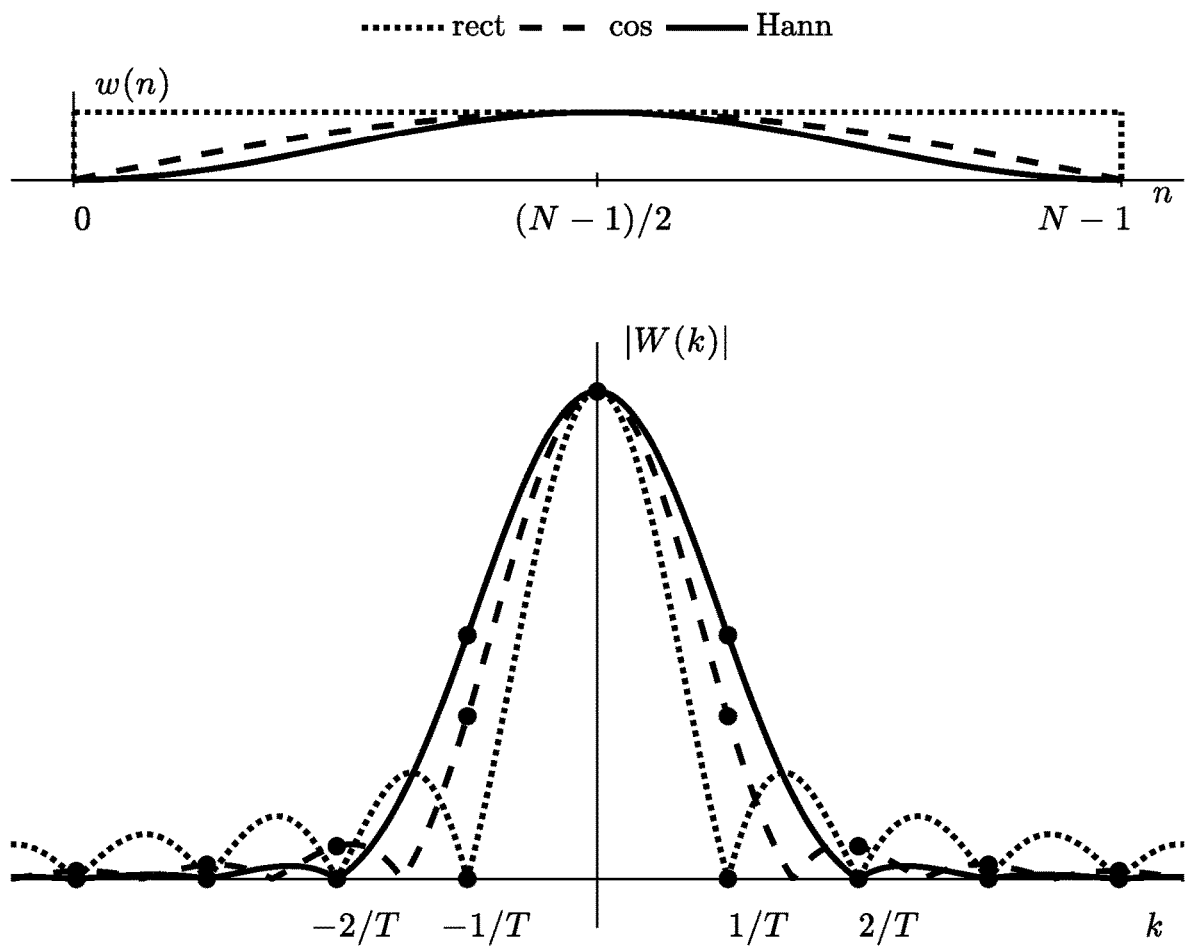
FIG. 4 illustrates at the top a time and frequency domain and at the bottom representations of three different $\cos^\alpha$ windows: the rectangular ($\alpha=0$), cosine ($\alpha=1$) and Hanning ($\alpha=2$)

The IpDFT solution can be analytically derived only for $\cos^\alpha$ windows (also known as $\sin^\alpha$ windows), that are defined as follows [16]:

$$w_\alpha(n) = \sin^\alpha\left(\frac{\pi}{N}n\right), n \in [0, N-1], \alpha \in \Box \tag{1}$$

being N the number of samples. In particular, FIG. 4 shows three different $\cos^\alpha$ window functions obtained for $\alpha = \{0, 1, 2\}$. As it can be noted, the window spectrum depends upon $\alpha$: as $\alpha$ decreases, the main lobe shrinks but the side lobes increase, whereas as a increases, the side lobes decrease but the main lobe becomes wider.

Generally, IpDFT algorithms were formulated for the so called Rife-Vincent class I windows, i.e., $\cos^\alpha$ windows characterized by a null or even value for $\alpha$. The most elementary one is the rectangular ($\alpha=0$), whose DFT is known as the Dirichlet kernel:

$$D_N(k) = e^{-j\pi k(N-1)/N} \frac{\sin(\pi k)}{\sin(\pi k/N)}, k \in [0, N-1] \tag{2}$$

This function is characterized by the narrowest main lobe among the $\cos^\alpha$ windows but at the same time it exhibits the highest side lobes.

In order to reduce the effects of spectral leakage generated by the side-lobe levels, IpDFT algorithms typically adopt bell-shaped windows, obtained by increasing the value of $\alpha$ in (1). The most common is the Hanning window ($\alpha=2$) defined as:

$$w_H(n)=0.5\cdot(1-\cos(2\pi n/N)), n\in[0,N-1] \tag{3}$$

and characterized by the following *DFT*:

$$W_H(k)=-0.25\cdot D_N(k-1)+0.5\cdot D_N(k)-0.25\cdot D_N(k+1), k\in [0,N-1] \tag{4}$$

that is known for the good trade-off between the main-lobe width and side-lobe levels [15].

More recent studies have derived the analytical solution of the IpDFT problem for $\cos^\alpha$ windows in the case of an odd value for $\alpha$ [17]. In applications where the main lobe width plays a crucial role in identifying relatively nearby tones, like in SE, the so-called cosine window, defined for $\alpha=1$, is an extremely attractive solution as it represents a compromise between the rectangular and the Hanning window:

$$w_C(n) = \sin\left(\frac{\pi}{N}n\right), n \in [0, N-1] \tag{5}$$

Its DFT can be derived as follows:

$$W_C(k)=-0.5jD_N(k-0.5)+0.5jD_N(k+0.5), k\in[0,N-1] \tag{6}$$

However, for an odd value for $\alpha$, the window is a weighted sum of Dirichlet kernels modulated by non-integers of the frequency resolution, therefore an intrinsic limitation arises: as it can be seen from FIG. 4, the $W_C(k)$ zero-crossing do not happen for integer values of k. As a consequence, also with coherent sampling, the cosine window generates spectral leakage.

B. The Interpolated DFT (IpDFT)

As known, the IpDFT is based on a static signal model that, in general, is assumed to contain a single unknown frequency component. In this respect, let us consider a finite sequence of N equally spaced samples x(n) obtained by sampling an input continuous signal x(t) with a sampling rate $F'_s=1/T_s$, being $T_s$ the sampling time:

$$x(n)=A_0\cos(2\pi f_0 n T_s+\varphi_0), n\in[0,N-1] \tag{7}$$

where $\{f_0, A_0, \varphi_0\}$ are the signal frequency, amplitude and initial phase respectively. The signal is assumed to be windowed with a discrete function of N samples w(n), being $T=N\cdot T_s$ the window length. As discussed in [18], the mismatch between this signal model and real voltage or current waveforms measured by PMUs is the main source of error of DFT-based SE algorithms.

The DFT X(k) of the windowed input signal is:

$$X(k) \triangleq \frac{1}{B}\sum_{n=0}^{N-1} w(n)x(n)W_N^{kn}, k \in [0, N-1] \tag{8}$$

where $$B \triangleq \sum_{n=0}^{N-1} w(n)$$

is the DFT normalization factor, and $W_N \triangleq e^{-j2\pi/N}$ is the so called twiddle factor. The DFT returns a sequence of N samples (also called bins) of the theoretical Discrete Time Fourier Transform (DTFT) that are uniformly spaced by the DFT frequency resolution $\Delta_f=1/T$. More specifically, based on the convolution theorem, the DFT of the windowed signal x(n) exhibits a pair of scaled, shifted and rotated versions of the DFT of the window function (see FIG. 5): the so-called positive image (in black), is shifted up to the tone frequency $f_0$, the so-called negative image (in grey), is shifted down to $-f_0$:

$$X(k)=X_0^+(k)+X_0^-(k) \tag{9}$$

where:

$$X_0^+(k) = A_0 e^{+j\varphi_0} W(k-f_0/\Delta_f)$$

$$X_0^-(k) = A_0 e^{-j\varphi_0} W(k+f_0/\Delta_f) \quad (10)$$

being W(k) the DFT of the adopted window function.

Figure 5:
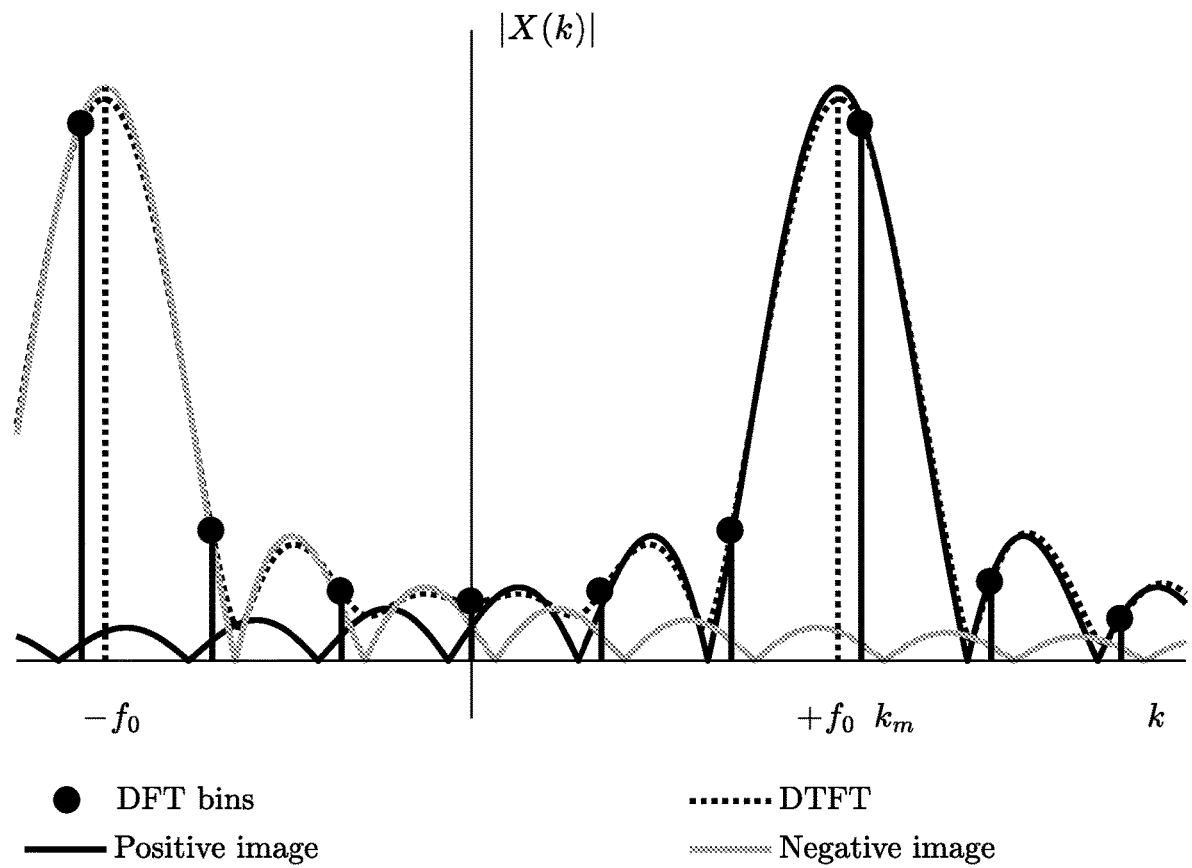
FIG. 5 shows DFT and DTFT of a steady state single-tone signal that is incoherently sampled and the related positive and negative images.

As shown in FIG. 5, in case of incoherent sampling ($f_0/\Delta_f \notin \square$), the peak value of the continuous spectrum of the fundamental tone of a signal is located between two consecutive DFT bins and the signal frequency can be expressed as:

$$f_0 = (k_m + \delta)\Delta_f \quad (11)$$

being $-0.5 \leq \delta < 0.5$ a fractional correction term and $k_m$ the index of the highest bin. The IpDFT problem lies in finding the correction term $\delta$ (and, consequently, the fundamental tone's parameters $\{f_0, A_0, \varphi_0\}$) that better approximates the exact location of the main spectrum tone.

The IpDFT problem solution has been originally provided as a 2-point interpolation scheme [14], [15]. More recently, multipoint interpolation schemes have demonstrated to inherently reduce the long-term spectral leakage effects, leading to more accurate interpolation results [7], [8]. In this respect, for the Hanning window, the fractional term g can be computed by interpolating the 3 highest DFT bins as [8]:

$$\delta = 2\varepsilon \cdot \frac{|X(k_m+\varepsilon)| - |X(k_m-\varepsilon)|}{|X(k_m-\varepsilon)| + 2|X(k_m)| + |X(k_m+\varepsilon)|} \quad (12)$$

$$A_0 = |X(k_m)| \left\|\frac{\pi\delta}{\sin(\pi\delta)}\right\| \left\|\delta^2 - 1\right\| \quad (13)$$

$$\varphi_0 = \angle X(k_m) - \pi\delta \quad (14)$$

Similarly, for the cosine window, g can be obtained by interpolating the 3 highest DFT bins as [17]:

$$\delta = 1.5\varepsilon \cdot \frac{|X(k_m+\varepsilon)| - |X(k_m-\varepsilon)|}{|X(k_m-\varepsilon)| + 2|X(k_m)| + |X(k_m+\varepsilon)|} \quad (15)$$

The fundamental tone's amplitude and phase can then be computed as (computational details are given in Appendix):

$$A_0 = 4 \cdot \frac{|\delta^2 - 0.25|}{|\cos(\pi\delta)|} \cdot |X(k_m)| \quad (16)$$

$$\varphi_0 = \angle X(k_m) - \pi\delta \quad (17)$$

C. Spectral Leakage Effects on the IpDFT

The main assumptions behind the formulation of the IpDFT technique are the following [14]:
1) The input signal is characterized by time-invariant parameters;
2) The input signal is sampled with a sampling rate sufficiently higher than the highest signal's spectral component;
3) The DFT bins used to perform the interpolation are only generated by the positive image of the tone under analysis.

In order to satisfy the first two assumptions when applying the IpDFT to SE, sampling rates in the order of few kHz and window lengths containing few periods of a signal at the rated power system frequency must be adopted respectively [19]. This choice causes the energy of the DFT spectrum to be concentrated in the lower frequency range and the positive and negative image of the main tone of the spectrum to be relatively close.

In such conditions, in case of incoherent sampling, the tails of the negative image of the spectrum main tone (grey curve in FIG. 5) leak into the positive frequency range and bias the DFT bins used to perform the interpolation (i.e., assumption 3) is not respected). This effect, also known as spectral interference has demonstrated to considerably corrupt the IpDFT estimations when applied to SE [9].

To cope with these conditions, in [6] a technique that mitigates the effect of the spectral leakage produced by the negative image of the spectrum is presented.

Figure 6:
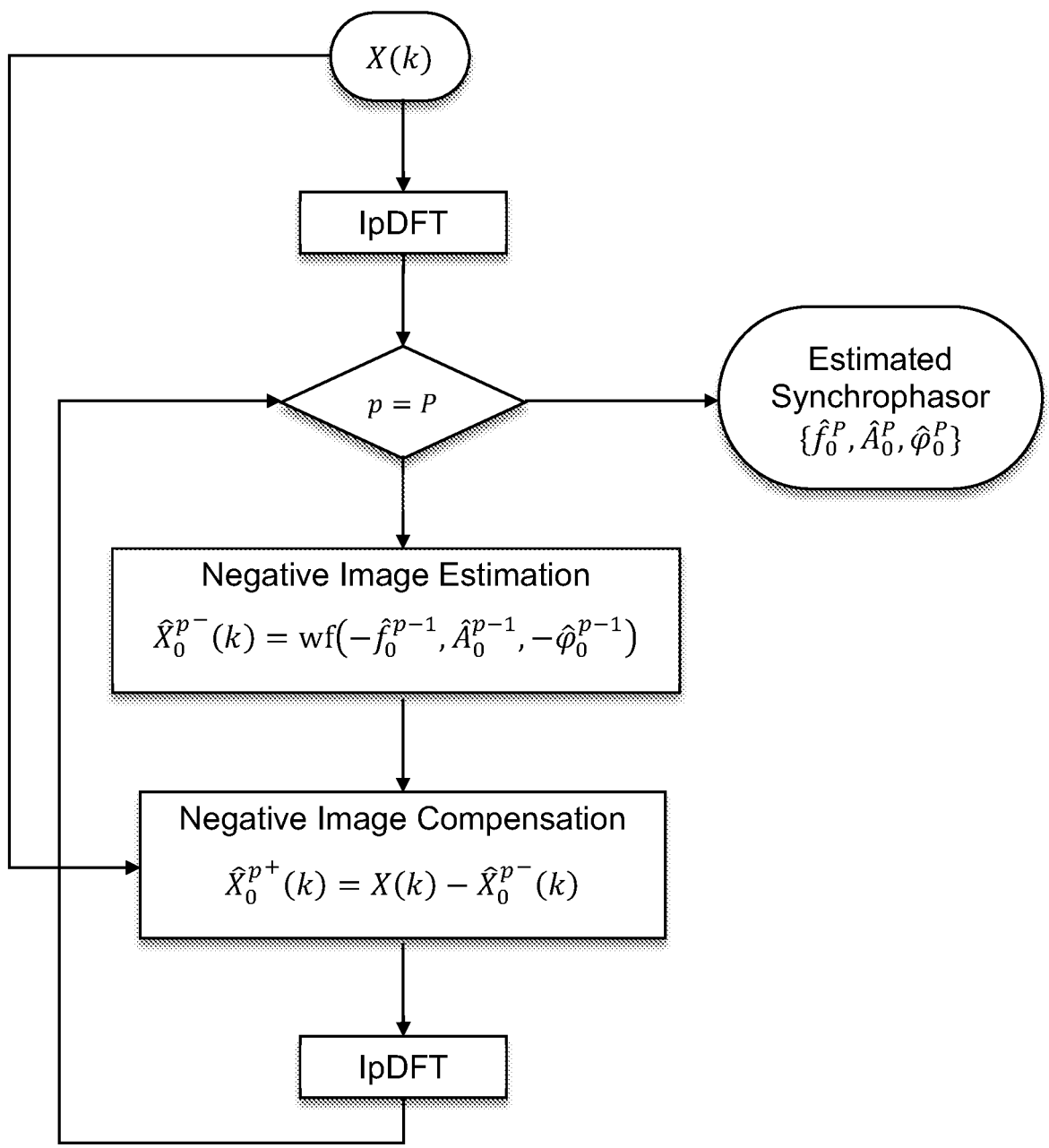
FIG. 6 contains a flowchart representation of the e-IpDFT.

The method is called enhanced-IpDFT (e-IpDFT), and is described by:

a) A flowchart in FIG. 6;

b) A pseudo-code, hereafter called Algorithm 1, in FIG. 7.

The e-IpDFT is described in what follows, by making reference to the lines of Algorithm 1, also shown in FIG. 7, where the function DFT refers to (8), IpDFT refers to (11)-(17) and wf to (10).

---

ALGORITHM 1: The e-IpDFT algorithm.

1: X(k) = DFT(x(n))
2: $\{\hat{f}_0^0, \hat{A}_0^0, \hat{\varphi}_0^0\}$ = IpDFT(X(k))
3: for p = 1 → P
4: $\hat{X}_0^{p-}(k)$ = wf($-\hat{f}_0^{p-1}, \hat{A}_0^{p-1}, -\hat{\varphi}_0^{p-1}$)
5: $\hat{X}_0^{p+}(k)$ = X(k) − $\hat{X}_0^{p-}(k)$
6: $\{\hat{f}_0^p, \hat{A}_0^p, \hat{\varphi}_0^p\}$ = IpDFT($\hat{X}_0^{p+}(k)$)
7: end for

---

It starts with a preliminary estimation of the main tone parameters obtained by applying the IpDFT to the DFT spectrum X(k) (line 2). These values are used to estimate the main tone's negative image $\hat{X}_0^-(k)$ (line 4), as in (10), that is then subtracted from X(k), to return an estimation of the main tone's positive image (line 5). The IpDFT is applied to the resulting spectrum, where the spectral interference produced by the negative image is considerably reduced (line 6). The compensation of the spectral interference produced by the negative image of the fundamental tone, can be improved by iterating the procedure a predefined number of times P (see Section IV.B). We summarize the method proposed in [6] by defining a single function e-IpDFT that accounts for lines 2-7 of Algorithm 1:

$$\{\hat{f}_0, \hat{A}_0, \hat{\varphi}_0\}|_P = e\text{-IpDFT}[X(k)] \quad (18)$$

The method presented in [6] does not account for the spectral interference produced by tones other than the fundamental one. As a consequence, it produces incorrect results in presence of interfering tones that are relatively close to the main one, such those defined in the OOBI test.

IV. The Proposed Iterative IpDFT (I-IpDFT)

This Section aims at presenting the i-IpDFT, that represents an enhancement of the method proposed in [6] as it takes into account the effects of the spectral interference generated by both the negative image of the main tone and a generic interfering one. More specifically, in Section IV.A we define the SE algorithm and in Section IV.B and IV.C we propose a procedure to tune the algorithm parameters.

A. The i-IpDFT Algorithm Formulation

Let us consider a steady-state discrete signal composed of two tones, a fundamental and an interfering tone (not necessary harmonic, i.e., $f_i/f_0 \in \mathbb{Q}$), both unknown:

$$x(n) = A_0 \cos(2\pi f_0 n T_s + \varphi_0) + A_i \cos(2\pi f_i n T_s + \varphi_i) \quad (19)$$

Figure 8:
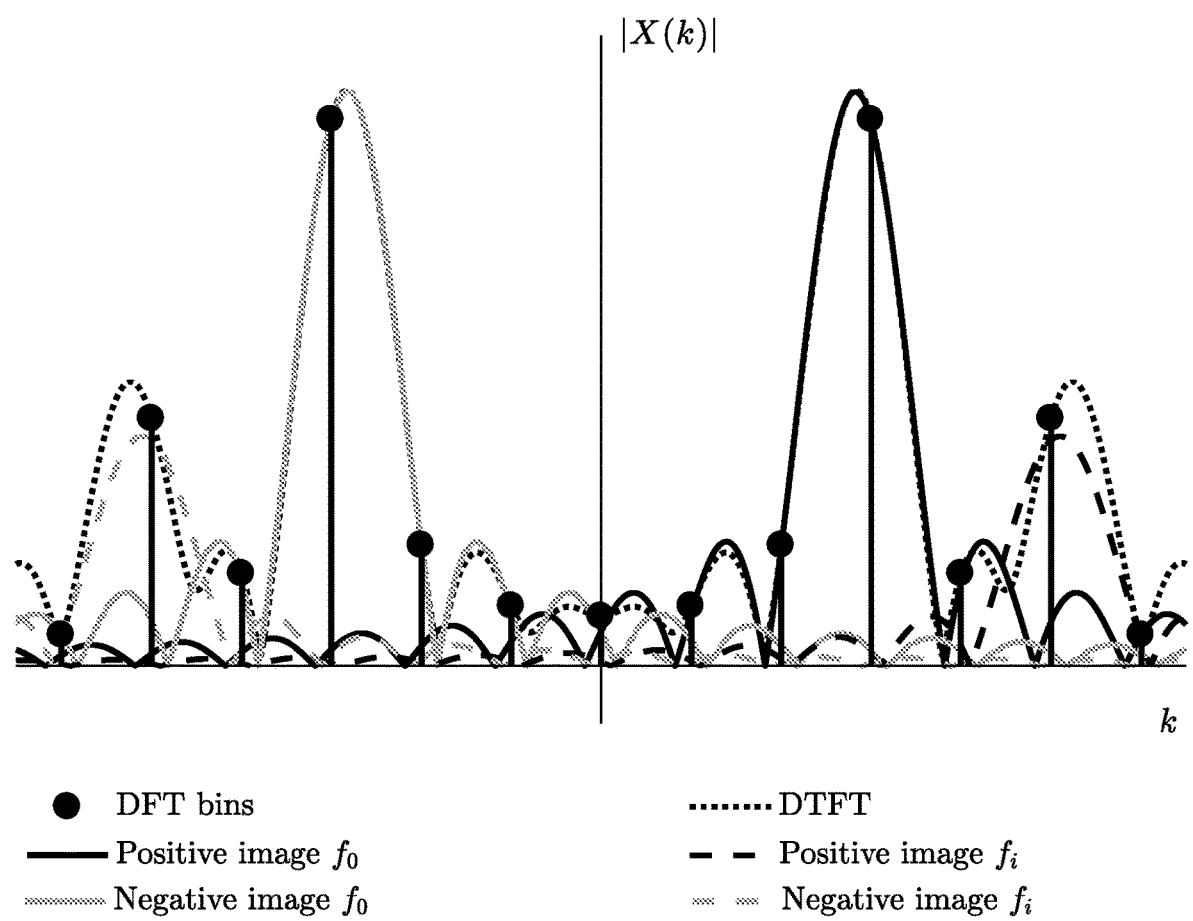
FIG. 8 shows DFT and DTFT of a steady state signal composed by a main tone and an interharmonic one and the related positive and negative images.

As shown in FIG. 8, its DFT spectrum can be modelled as the sum of the positive (in black) and negative (in grey) images of the fundamental (solid line) and interfering (dashed line) tones:

$$X(k) = X_0(k) + X_i(k) = X_0^+(k) + X_0^-(k) + X_i^+(k) + X_i^-(k) \quad (20)$$

The proposed i-IpDFT algorithm iteratively estimates and compensates the effects of spectral leakage generated by an interfering tone and by the negative image of the main tone, such that the IpDFT is applied to a DFT spectrum that is only composed by the positive image of the main tone $X_0^+(k)$.

Figure 9:
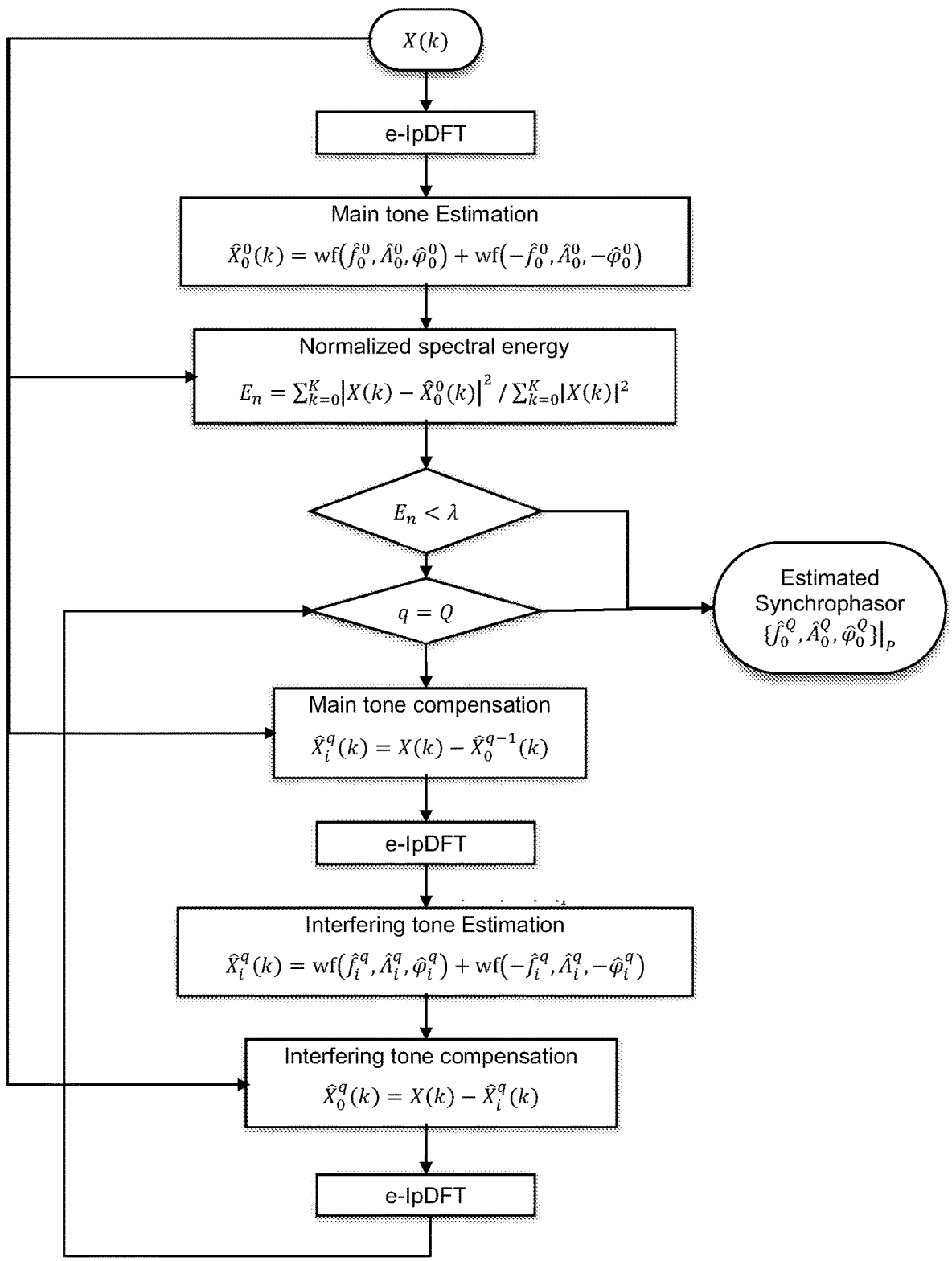
FIG. 9 contains a flowchart representation of the i-IpDFT according to the invention.
Figure 11:
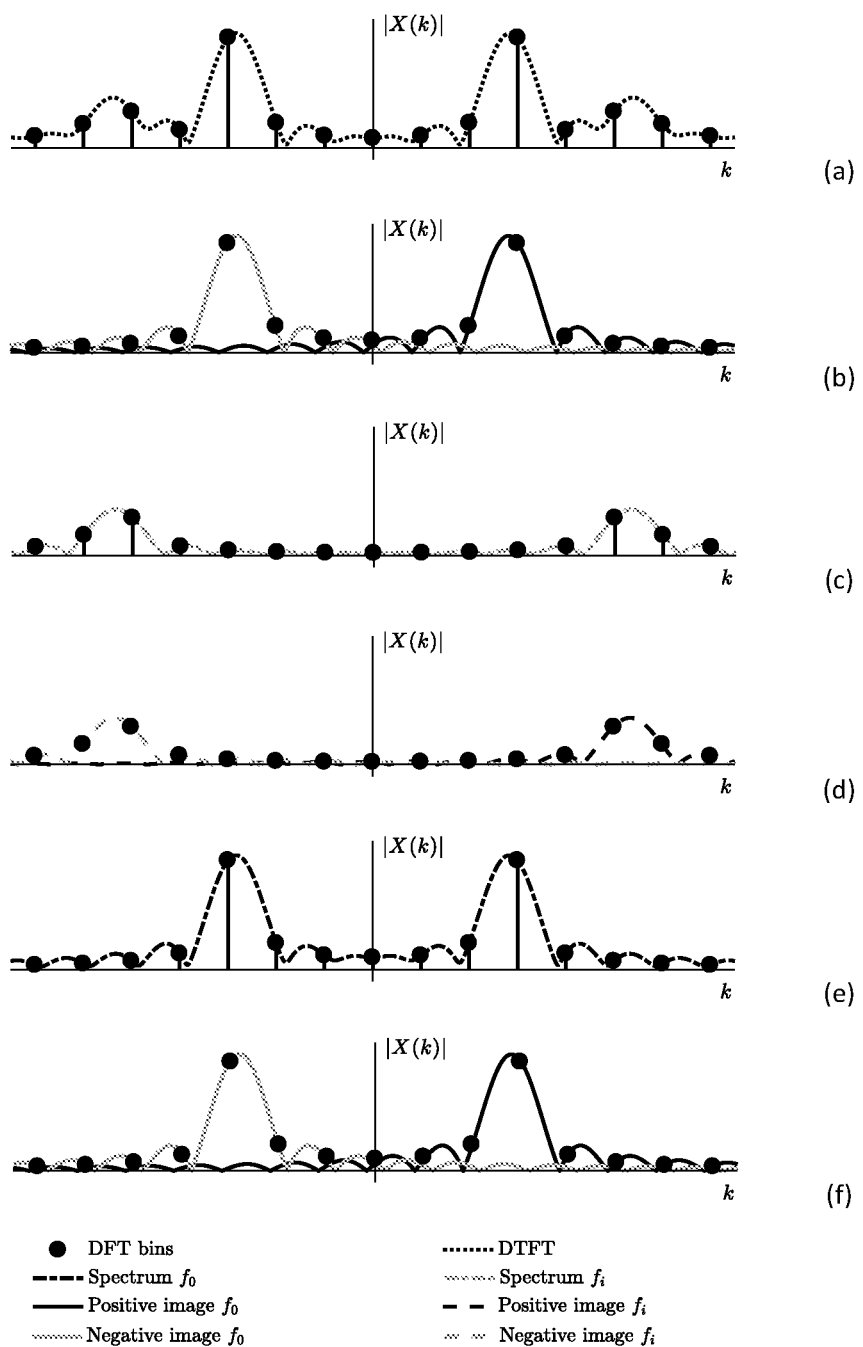
FIG. 11 shows spectra processed at different steps of the i-IpDFT, by making reference to lines of Algorithm 2 shown in FIG. 10: $X(k)$ in line 1 (a); $\hat{X}_0(k)^0$ in line 3 (b); $X(k)-\hat{X}_0^{q-1}(k)$ in line 4 and 6 (c); $\hat{X}_i^q(k)$ in line 7 (d); $X(k)-\hat{X}_i^q(k)$ in line 8 (e); $\hat{X}_0^q(k)$ in line 9 (f)

The proposed i-IpDFT is described by:
c) A flowchart in FIG. 9;
d) A pseudo-code, hereafter called Algorithm 2, in FIG. 10;
e) A representation of the spectra processed during successive steps of the method in FIG. 11.

The i-IpDFT is described in what follows, by making reference to the lines of Algorithm 2, also shown in FIG. 10.

---

ALGORITHM 2: The i-IpDFT algorithm.

```
 1: X(k) = DFT(x(n))
 2: {f̂₀⁰, Â₀⁰, φ̂₀⁰} |_P = e-IpDFT[X(k)]
 3: X̂₀⁰(k) = wf(f̂₀⁰, Â₀⁰, φ̂₀⁰) + wf(-f̂₀⁰, Â₀⁰, -φ̂₀⁰)
 4: if Σ|X(k) - X̂₀⁰(k)|² > λ · Σ|X(k)|²
 5:    for q = 1 → Q
 6:       {f̂ᵢq, Âᵢq, φ̂ᵢq} |_P = e-IpDFT[X(k) - X̂₀^(q-1)(k)]
 7:       X̂ᵢq(k) = wf(f̂ᵢq, Âᵢq, φ̂ᵢq) + wf(-f̂ᵢq, Âᵢq, -φ̂ᵢq)
 8:       {f̂₀q, Â₀q, φ̂₀q} |_P = e-IpDFT[X(k) - X̂ᵢq(k)]
 9:       X̂₀q(k) = wf(f̂₀q, Â₀q, φ̂₀q) + wf(-f̂₀q, -Â₀q, -φ̂₀q)
10:    end for
11: else
12:    break
13: end if
```

---

The first steps (lines 1-2) of the i-IpDFT algorithm exactly correspond to the e-IpDFT technique. Although, in presence of an interfering tone, the estimated main tone parameters might be largely biased, they can be used to approximate the positive and the negative image of the fundamental tone (line 3, FIG. 11b). The latter are then subtracted from the original DFT bins to produce a spectrum $X(k) - \hat{X}_0(k)$ that accounts for any spurious contribution perturbing the fundamental tone of the signal (line 4, FIG. 11c).

In case an interfering tone is detected, the procedure that estimates and compensates its spectral interference must be activated. Otherwise the method stops and returns the parameters $\{\hat{f}_0^0, \hat{A}_0^0, \hat{\varphi}_0^0\}$ estimated at line 2. If an interfering tone is present, the spectral energy of $X(k) - \hat{X}_0^0(k)$ weighted by the spectral energy of $X(k)$, exceeds a certain threshold A (see Section IV.C for further details):

$$E_n = \frac{E[X(k) - \hat{X}_0^0(k)]}{E[X(k)]} = \frac{\sum_{k=0}^{K} |X(k) - \hat{X}_0^0(k)|^2}{\sum_{k=0}^{K} |X(k)|^2} > \lambda \quad (21)$$

where K is the total number of computed DFT bins. In such a case, the e-IpDFT is applied to $X(k) - \hat{X}_0^{q-1}(k)$, to estimate the parameters $\{\hat{f}_i^q, \hat{A}_i^q, \hat{\varphi}_i^q\}$ of the detected interharmonic tone (line 6). The latter, are used to evaluate both the positive and negative image of the interharmonic tone (line 8, FIG. 11e), that are then subtracted from the original DFT bins, obtaining the spectrum $X(k) - \hat{X}_i^q(k)$ that does not contain the interfering tone (line 7, FIG. 11d). Finally, the e-IpDFT is applied to such spectrum leading to an enhanced estimation of the main tone parameters $\{\hat{f}_0^q, \hat{A}_0^q, \hat{\varphi}_0^q\}$ (line 8, FIG. 11f).

The whole procedure can be iterated a predefined number of times Q, leading to more and more accurate estimates as Q increases (see Section IV.B).

The presented i-IpDFT algorithm can be formulated for any window function, number of IpDFT interpolation points, window length and sampling frequency. Even though it has been formulated for a single interfering component, it can be easily extended to consider more than one interfering component. In this respect, it is worth mentioning that the amount of DFT bins to be calculated at line 1 depends on the highest frequency component that has to be compensated.

B. On the Tuning of the Number of Iterations P and Q

The performance of the i-IpDFT algorithm are mainly influenced by two parameters, and in what follows a procedure to select them is presented:

P: the number of iterations of the compensation of the spectral interference generated by the negative image of the tone under analysis (see Algorithm 1);

Q: the number of iterations of the overall procedure (see Algorithm 2).

Figure 12:
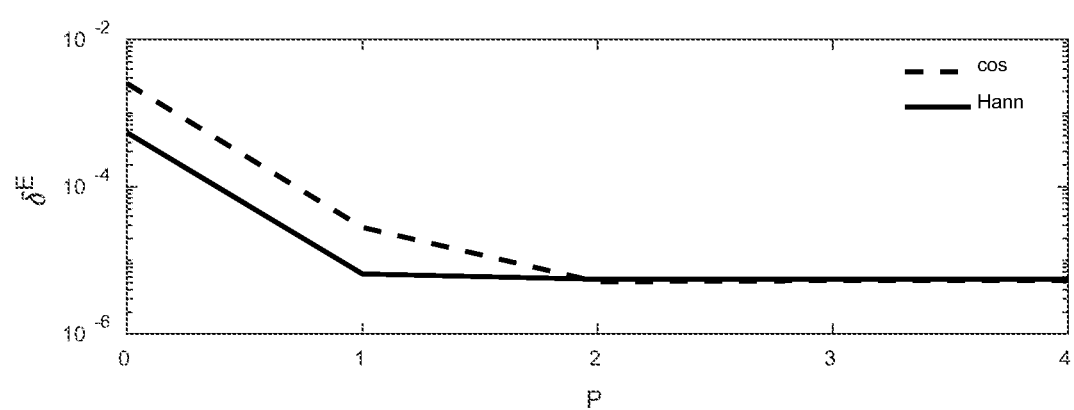
FIG. 12 contains a graph showing error in estimating the IpDFT correction term $\delta$ with the e-IpDFT technique, as a function of P: signal at $f_0=47.5$, $F_s=50$ kHz, T=60 ms.

The effects of P can be evaluated when applying the e-IpDFT technique to a single-tone signal that is incoherently sampled. In this respect, FIG. 12 shows the accuracy in estimating the IpDFT correction term δ as a function of P, when analyzing a signal at 47.5 Hz with a sampling rate of 50 kHz and a window length of 60 ms. In order to emulate more realistic conditions, the signal is characterized by an 80 dB Signal-to-Noise Ratio (SNR) [20]. As it can be noted, in this specific case, the effect of the compensation becomes negligible after P=2 iterations both for the Hanning and the cosine windows. In general, this is not always the case and the number of iterations gets higher as the relative distance between the positive and negative images gets smaller. Nevertheless, due to its good trade-off between the overall algorithm performance and computational complexity, in the following the results will be presented for P=2.

The effects of the overall number of iterations Q are evaluated when applying the i-IpDFT algorithm to a signal corrupted by an inter-harmonic tone. In particular, the case of a signal characterized by a main tone at 47.5 Hz and an inter-harmonic tone at 20 Hz is presented (similar results hold for all combinations of $f_0$ and $f_i$ in the GOBI range). Again, an 80 dB SNR is considered [20].

Figure 13:
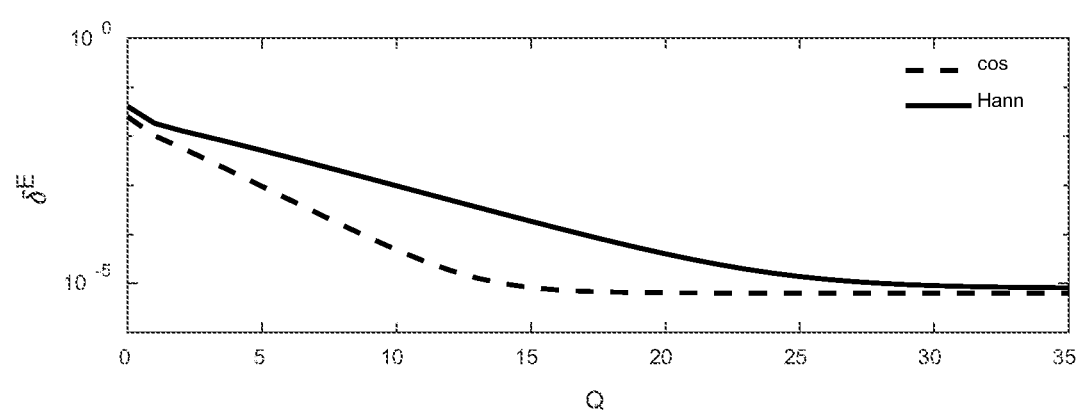
FIG. 13 contains a graph showing error in estimating the correction term $\delta$ with the i-IpDFT technique, as a function of Q: signal at $f_0=47.5$ Hz corrupted by an interfering tone at $f_i=20$ Hz, $F_s=50$ kHz, T=60 ms.

FIG. 13 shows the error in estimating the IpDFT correction term g with the i-IpDFT technique ($F_s$=50 kHz, T=60 ms) as a function of Q. For the cosine window the effects of the compensation become negligible after Q=16 iterations, whereas for the Hanning window after Q=28 iterations. This result is explained by the fact that the narrower main lobe of the cosine window allows to detect (and therefore compensate) the interharmonic tone with a smaller number of iterations. As a consequence, in the following, the i-IpDFT results are presented for Q=16 and Q=28 for the cosine and Hanning window respectively.

C. On the Tuning of the Threshold λ

The threshold λ must be set so that the iterative compensation (i.e., lines 5-10 of Algorithm 2) is activated in presence of an inter-harmonic tone. Furthermore, the proposed technique can turn out to be extremely useful to compensate the spectral leakage generated by an harmonic tone when using the cosine window, which has demonstrated to generate spectral leakage also with coherent sampling.

Figure 14:
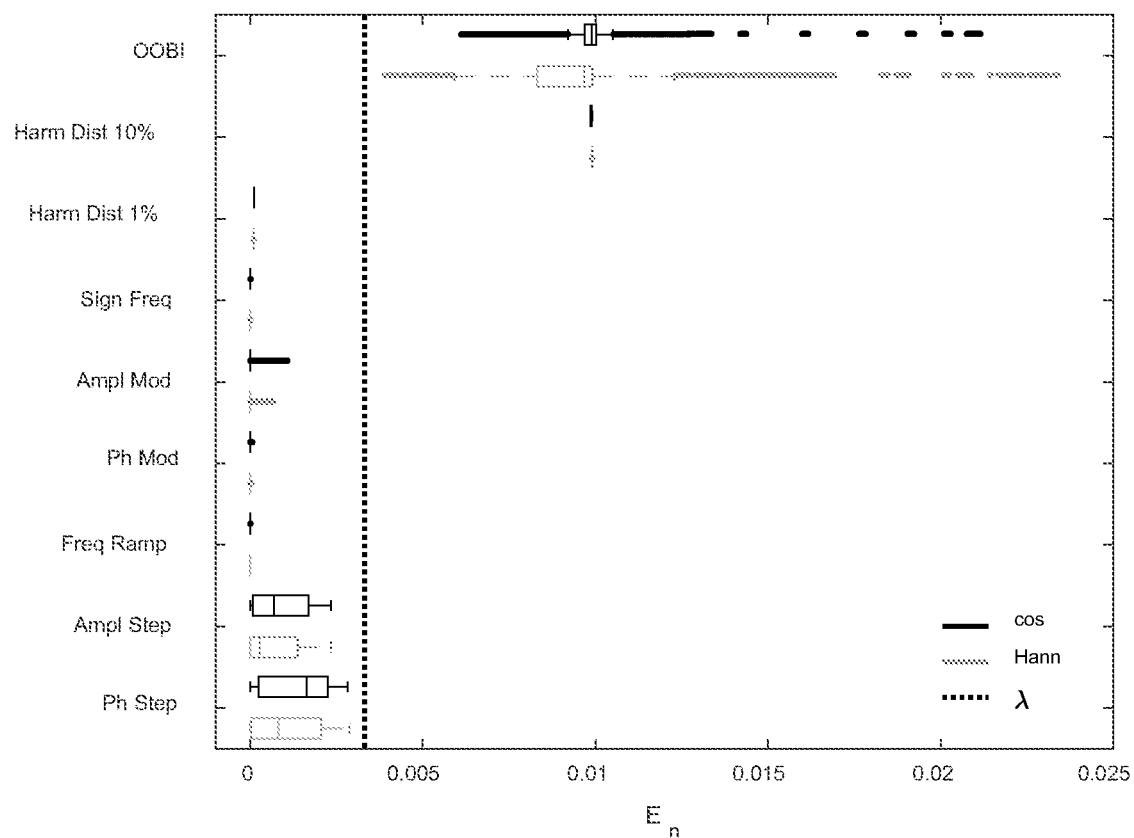
FIG. 14 contains a Boxplot representation of $E_n$ in all operating conditions indicated in [1]: $F_s=50$ kHz, $f_n=50$ Hz, T=60 ms.

In general, the normalized spectral energy $E_n$ can contain contributions generated by an interfering tone (e.g., harmonic or interharmonic) as well as any spurious component generated by a dynamic event that is wrongly captured by the DFT (e.g., steps in amplitude and in phase or amplitude and phase modulations). In this respect, FIG. 14 shows the variability of $E_n$ by means of a boxplot representation for the various testing conditions dictated by [1]. FIG. 14 shows that, when the main tone is corrupted by a 10% harmonic or inter-harmonic component, the values of $E_n$ are relatively higher than all the other testing conditions. Therefore, in the following, the value of $\lambda$ is set to $3.3 \cdot 10^{-3}$, in order to activate the algorithm only in presence of interfering components higher than 10% of the fundamental tone.

V. Performance Assessment

The IEEE Std. C37.118 [1] and its latest amendment [21] have defined two performance classes and related measurement requirements, to which PMUs must comply with: P-class, intended for protection applications, and M-class, for measurement ones. The main difference between P and M-class requirements is represented by the Out-Of-Band Interference (GOBI) test, defined for M-class only, that is meant to assess the PMU capability to reject superposed interharmonics close to the fundamental tone. In this regard, we carry out the numerical validation of the i-IpDFT algorithm in a simulation environment, by making reference to the static and dynamic performance requirements dictated by [1] and following the testing procedures described in the IEEE Guide C37.242 [22]. In order to limit the number of tests, the nominal frequency and the reporting rate have been fixed to 50 Hz and 50 frames-per-second respectively. For each test, the results are presented by means of three graphs showing the maximum Total Vector Error (TVE), Frequency Error (FE) and Rate Of Change Of Frequency (ROCOF) Error (RFE) as a function of the independent variable of the specific test, together with the maximum limit allowed by [1] for both P and M-class PMU. Moreover, two tables summarize the maximum obtained TVE, FE and RFE and the maximum limit allowed by [1] in all tests. Although [1] does not provide any guidelines regarding the noise, additive white Gaussian noise with zero mean and variance corresponding to an 80 dB SNR is added to the various reference signals, in order to simulate more realistic conditions [20].

As resumed in FIG. 22 the i-IpDFT algorithm results are shown for both the Hanning (solid lines) and cosine windows (dotted lines), using a sampling rate of 50 kHz and a window containing 3 periods of a signal at the nominal power system frequency. The first 10 DFT bins of the spectrum are computed, in order to be able to compensate the effects of any interfering component up to the $3^{rd}$ harmonic. The 3-points IpDFT is used to estimate the fractional correction term $\delta$.

Finally, the ROCOF is computed by means of a classical backward first-order approximation of a first-order derivative:

$$\text{ROCOF}(n) = |\hat{f}_0(n) - \hat{f}_0(n-1)| \cdot F_r \quad (1)$$

where $\hat{f}_0(n)$ and $\hat{f}_0(n-1)$ represent the fundamental frequency estimations at two successive reporting times.

A. Static Conditions

Figure 15:
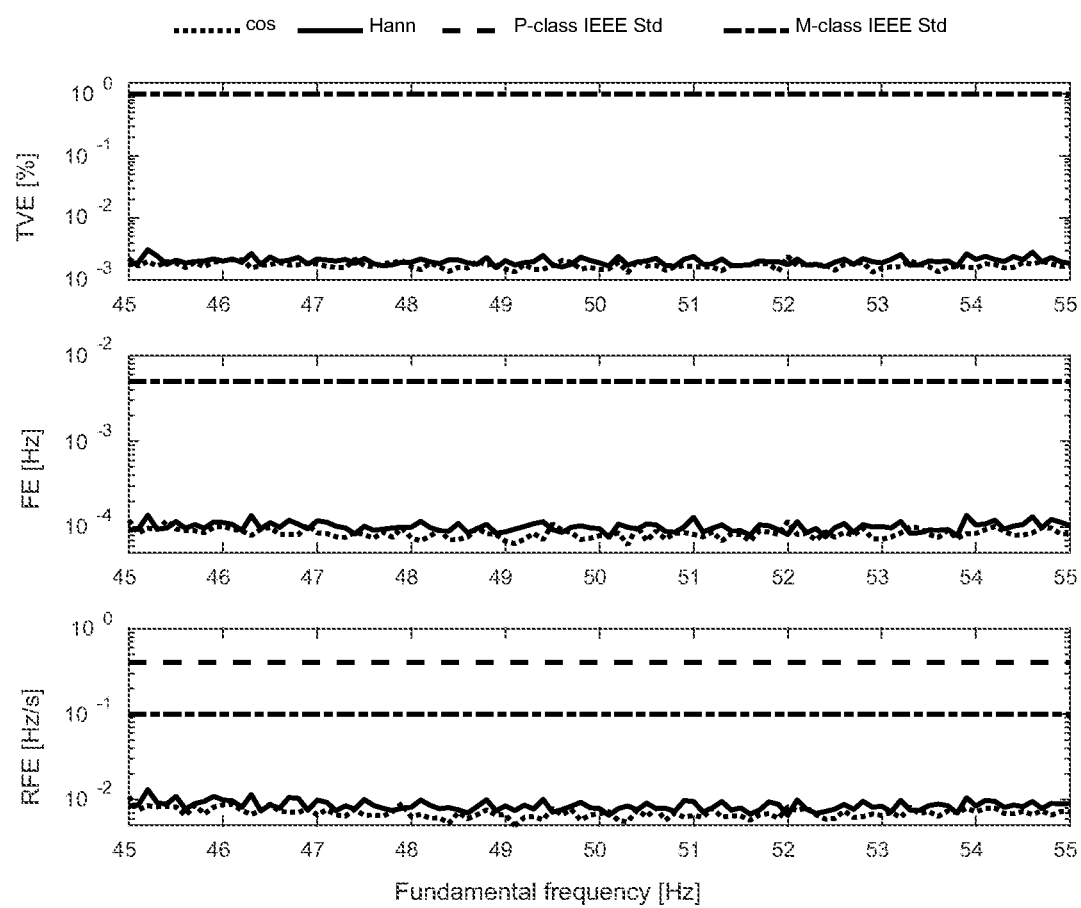
FIG. 15 shows a signal frequency test (for TVE and FE the P and M-class limits coincide) [1]
Figure 16:
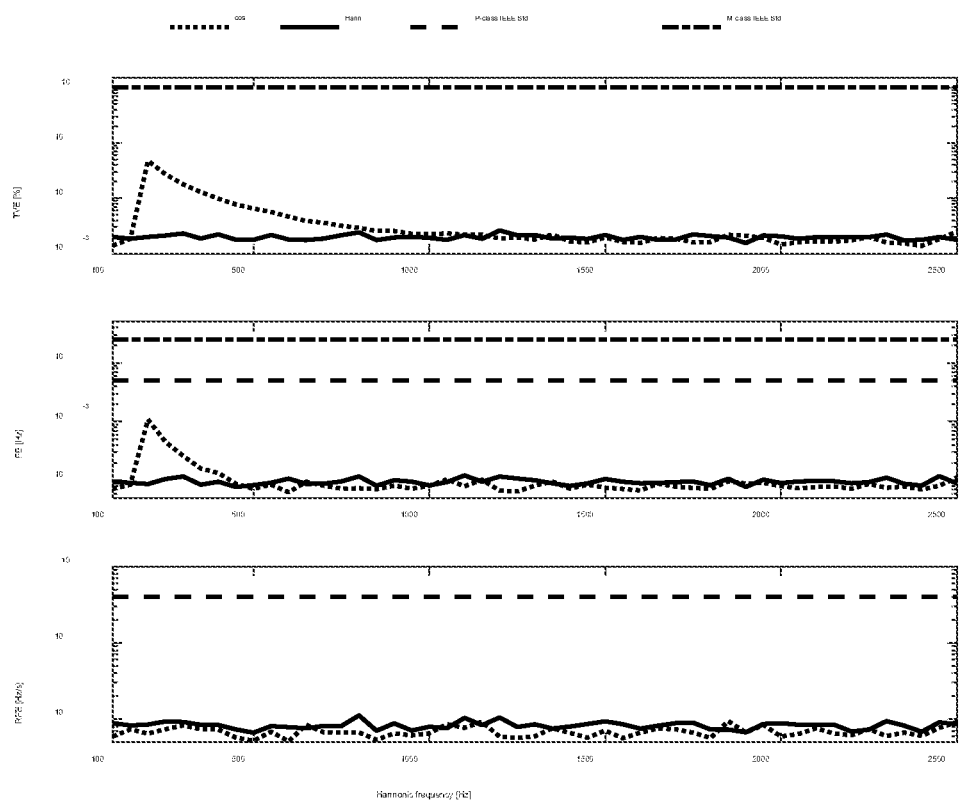
FIG. 16 shows a harmonic distortion test (for TVE the P and M-class limits coincide, whereas for RFE no P-class limit is defined) [1]
Figure 17:
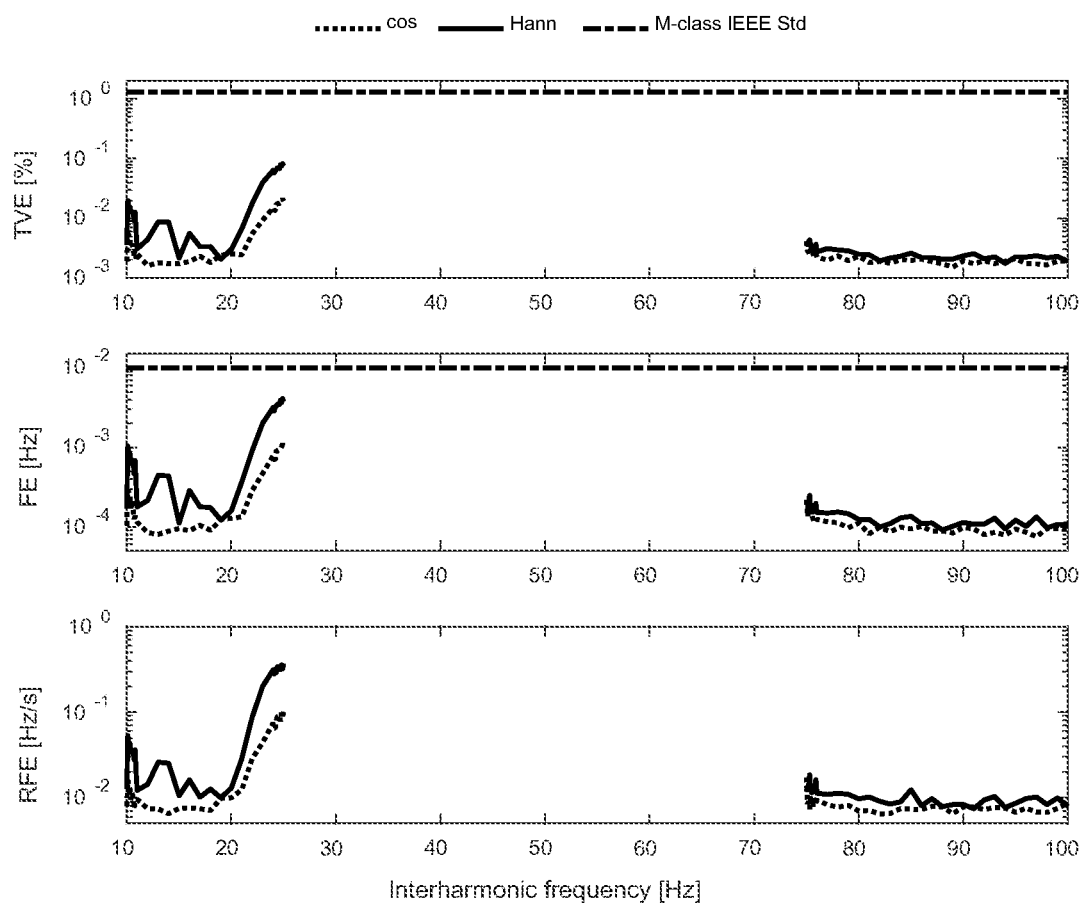
FIG. 17 shows a OOBI test (the test is defined for M-class PMUs only, and no limit for the RFE is defined) [1]

Regarding the steady state conditions (see FIG. 15, FIG. 16, FIG. 17 and FIG. 22), three cases are analyzed according to [1]:

Signal frequency: single-tone signals in the frequency range $45 \leq f_0 \leq 55$ Hz (FIG. 15);

Harmonic distortion: signals distorted by a single 10% harmonic in the frequency range $100 \leq f_h \leq 2500$ Hz (FIG. 16);

OOBI: signals characterized by a fundamental frequency $f_0$ of 47.5, 50 and 52.5 Hz, distorted by single 10% interharmonics in the frequency range $10 \leq f_i \leq 25$ Hz and $75 \leq f_i \leq 100$ Hz (FIG. 17).

During the signal frequency test (see FIG. 15), the errors are not influenced by the fundamental tone frequency. Regarding the harmonic distortion test (see FIG. 16), in case the Hanning window is adopted, the errors are invariant with respect to the harmonic order, due to the fact that both the fundamental and the harmonic tone are coherently sampled. On the contrary, for the cosine window the two tones are not coherently sampled, therefore the effects of spectral leakage are significant, worsening the IpDFT results especially for lower harmonic orders. It is worth mentioning that, in case $A_h = 10\% A_0$, for the second and third harmonic the weighted energy $E_n$ exceeds the threshold $\lambda$, activating the procedure that compensates the detected harmonic tone, leading to smaller errors even for the cosine window.

As far as the OOBI test is concerned (see FIG. 17), the graphs show the maximum obtained errors among the 3 considered fundamental frequencies. The TVE and FE are within the limits required by [1] for every combination of interharmonic and fundamental frequencies, for both cosine and Hanning window. Even though [1] does not define any specific limit for the RFE, the obtained results show that we are capable of estimating the ROCOF with similar performance as in the harmonic distortion test. To be more precise, the most challenging condition is when the two tones have frequencies that are close together and their images are not detectable due to short-term spectral leakage. In case $f_0 = 47.5$ Hz, this occurs for $20 \leq f_i \leq 25$ Hz, whereas in case $f_0 = 52.5$ Hz, this occurs for $75 \leq f_i \leq 80$ Hz.

B. Dynamic Conditions

Figure 18:
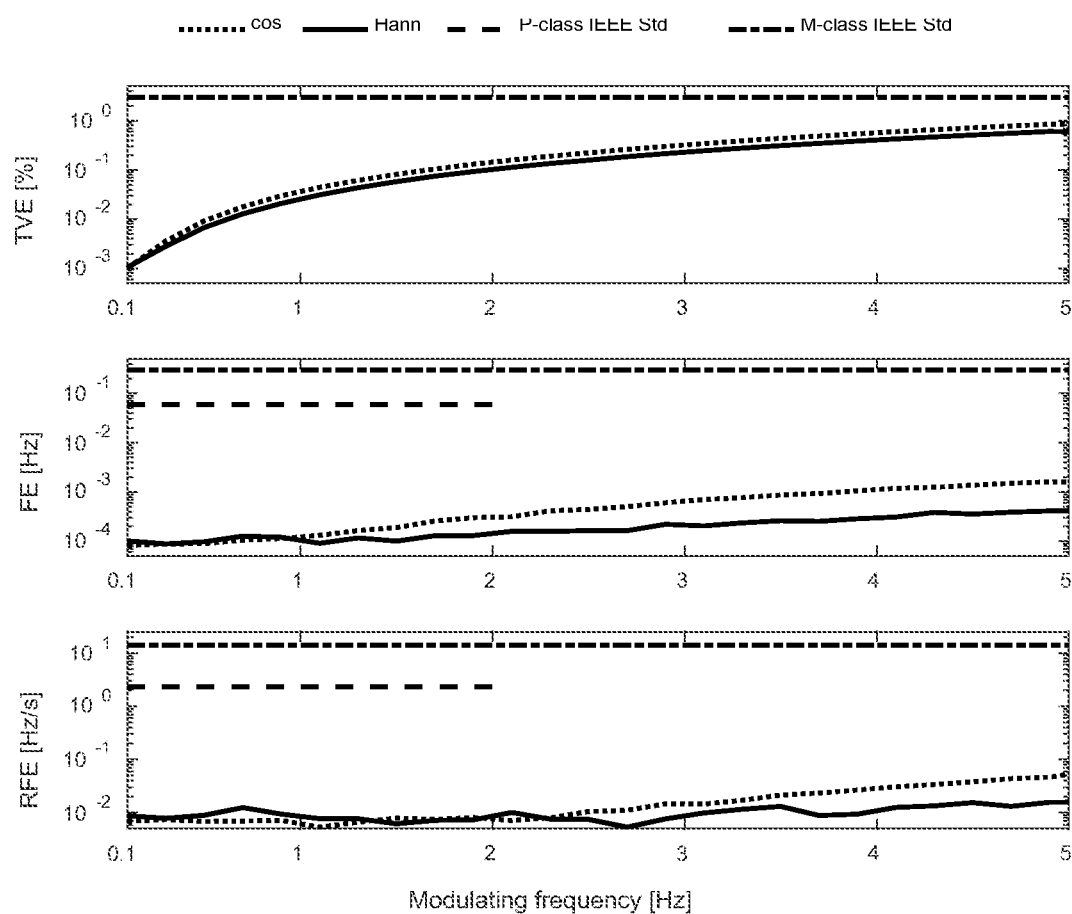
FIG. 18 shows an amplitude modulation test (for TVE the P and M-class limits coincide) [1] (similar results hold for phase modulation test)
Figure 19:
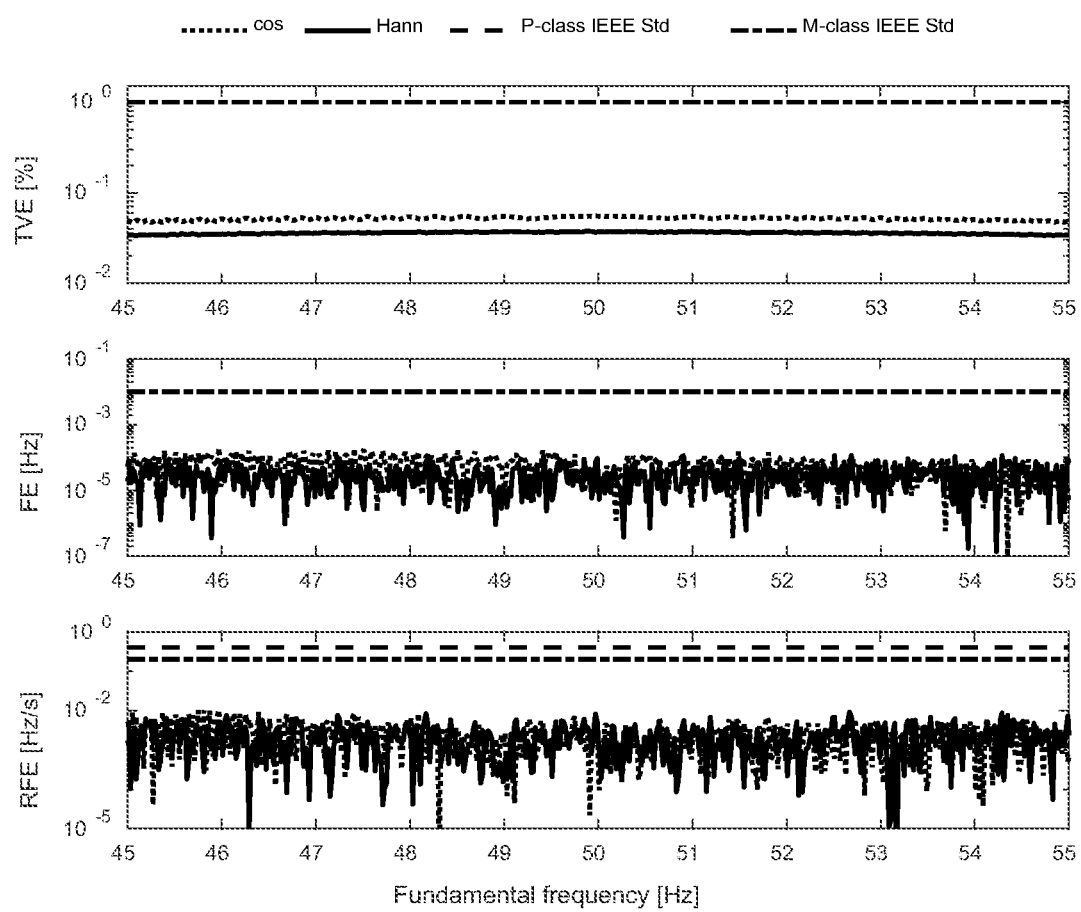
FIG. 19 shows a positive frequency ramp test (for TVE and FE the P and M-class limits coincide) [1] (similar results hold for negative frequency ramp test)
Figure 20:
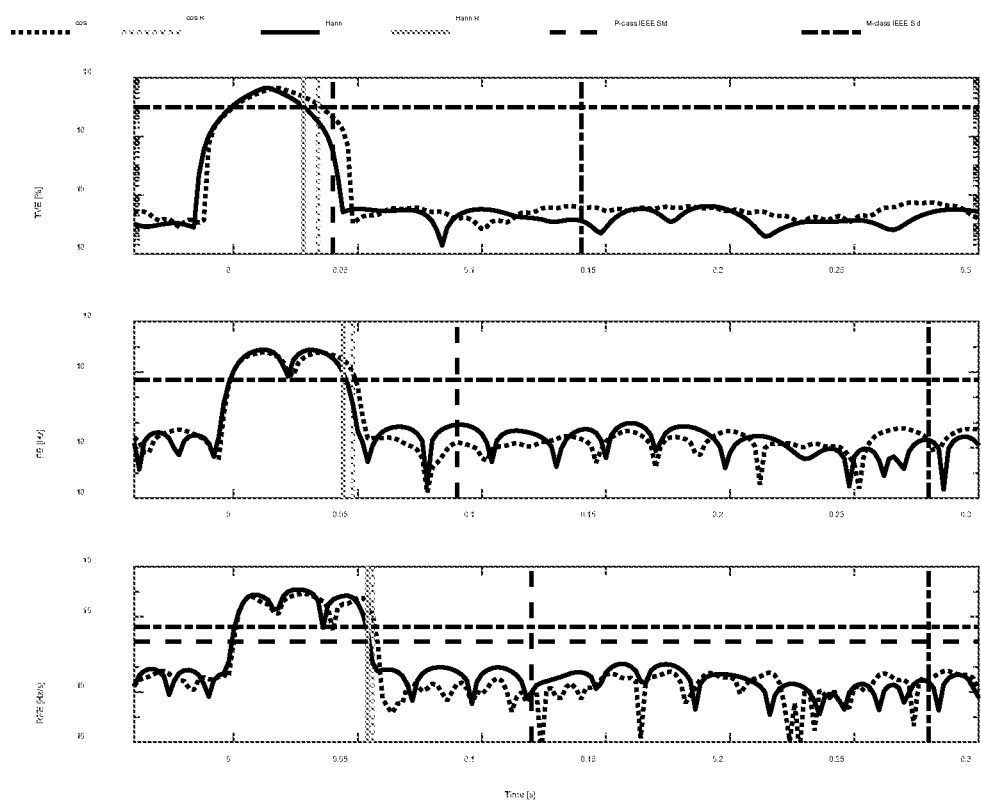
FIG. 20 shows a positive amplitude step test (for TVE and FE the P and M-class limits coincide) [1] (similar results hold for negative step test)
Figure 21:
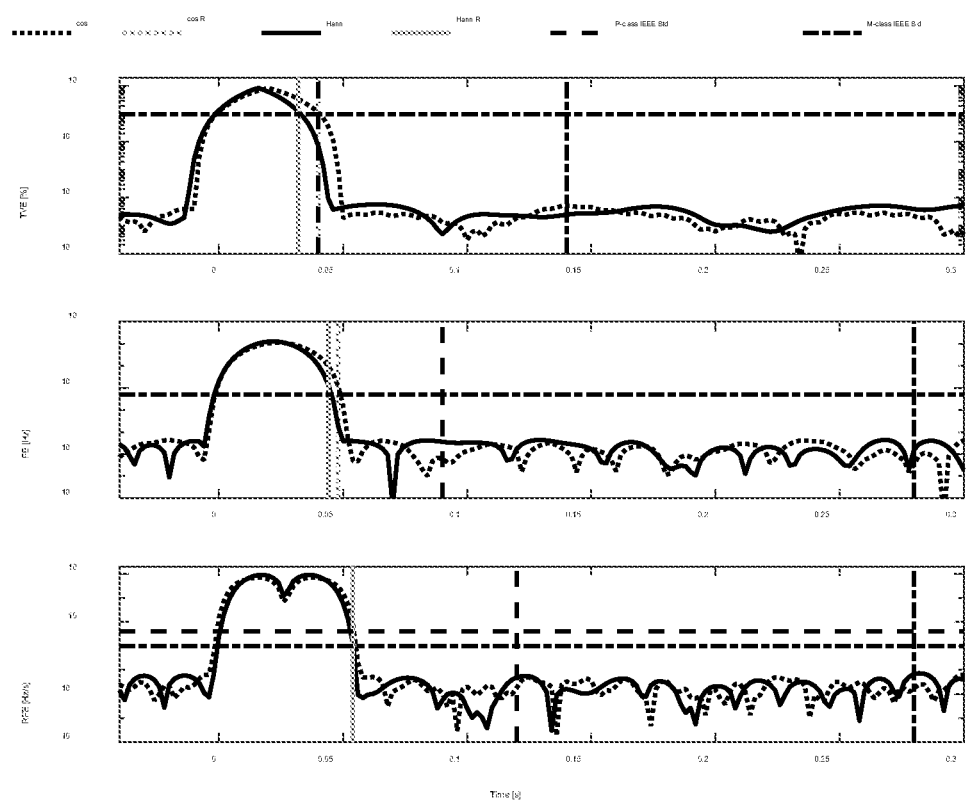
FIG. 21 shows a positive phase step test (for TVE and FE the P and M-class limits coincide) [1] (similar results hold for negative step test)
Figure 24:
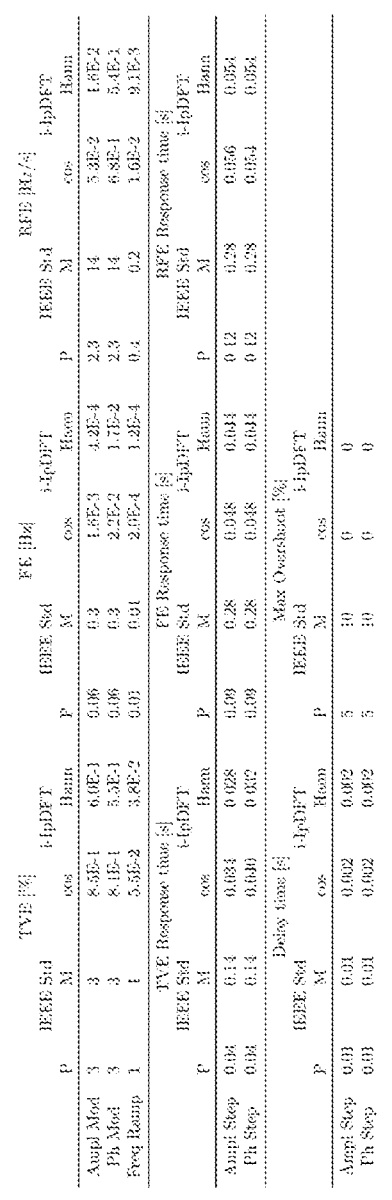

Regarding the dynamic conditions (see FIG. 18, FIG. 19, FIG. 20, FIG. 21 and FIG. 24), three cases are analyzed according to [1]:

Measurement bandwidth: signals characterized by phase and amplitude modulations, being $0.1 \leq f_m \leq 5$ Hz the modulating frequency (FIG. 18);

Frequency ramp: signals characterized by positive and negative frequency ramps in the frequency range $45 \leq f_0 \leq 55$ Hz at a rate of $\pm 1$ Hz/s (FIG. 19);

Amplitude and phase steps: signals characterized by positive and negative amplitude ($\pm 10\%$) and phase ($\pm \pi/18$) steps (FIG. 20 and FIG. 21).

During the measurement bandwidth test (see FIG. 18 for the amplitude modulation results), despite the errors increase with the modulating frequency, they are always well within the limits required by [1] (a similar trend characterizes the phase modulation). As for the Frequency ramp, the errors fully satisfy the requirements and are comparable with those obtained during the signal frequency test (FIG. 19 shows the positive frequency ramp, similar results hold for the negative one). Finally, regarding the amplitude and phase steps (see FIG. 20 and FIG. 21 for the positive step cases), the errors are represented as a function of the measured response time. The results show that, during positive steps, the errors return below the limits within the allowed response times without any overshoot (similar results hold for the negative step cases).

APPENDIX

Solution of the IpDFT Problem Using the Cosine Window

The analytical formulation of the IpDFT correction term δ for the cosine window given in (15) is derived in [17]. Regarding the tone's amplitude given in (16), no derivation was found in the existing literature.

If the number of samples N is sufficiently large, the following approximation is valid [19]:

$$e^{\pm j\frac{\pi}{2}(N-1)/N} \approx \pm j \qquad (23)$$

Moreover, sine functions are approximated by their arguments in the case of small angles. The Dirichlet kernel evaluated in k±0.5 can be then approximated as:

$$D_N(k \pm 0.5) = \qquad (24)$$

$$\mp je^{-j\pi k(N-1)/N}\frac{\sin(\pi k \pm \pi/2)}{\sin(\pi(k \pm 0.5)/N)} \approx -\frac{jN}{\pi}e^{-j\pi k(N-1)/N}\frac{\cos(\pi k)}{k \pm 0.5}$$

Therefore, the DFT of the cosine window in (6) can be approximated as:

$$W_C(k) = -\frac{N}{2\pi}e^{-j\pi k(N-1)/N}\frac{\cos(\pi k)}{k^2 - 0.25} \qquad (25)$$

The tone's amplitude $A_0$ corresponds to the modulus of the DTFT of the signal evaluated at frequency $f_0 = k_m + \delta$:

$$A_0 = |X(k_m + \delta)| \qquad (26)$$

Its value can be derived as a function of the highest amplitude DFT bin:

$$\frac{|X(k_m + \delta)|}{|X(k_m)|} \approx \frac{|W_C(0)|}{|W_C(-\delta)|} = 4 \cdot \frac{|\delta^2 - 0.25|}{|\cos(\pi\delta)|} \qquad (27)$$

leading to (16). The approximation sign is used instead of equality, because the ratios might differ due to spectral leakage [19].

REFERENCES

[1] "IEEE Standard for Synchrophasor Measurements for Power Systems," *IEEE Std C37.118.1-2011 (Revision IEEE Std C37.118-2005)*, pp. 1-61, December 2011.

[2] A. J. Roscoe, "Exploring the relative performance of frequency-tracking and fixed-filter phasor measurement unit algorithms under C37.118 test procedures, the effects of interharmonics, and initial attempts at merging P-class response with M-class filtering," IEEE Transactions on Instrumentation and Measurement, vol. 62, no. 8, pp. 2140-2153, August 2013.

[3] P. Castello, J. Liu, C. Muscas, P. A. Pegoraro, F. Ponci, and A. Monti, "A fast and accurate PMU algorithm for P+M class measurement of synchrophasor and frequency," IEEE Transactions on Instrumentation and Measurement, vol. 63, no. 12, pp. 2837-2845, December 2014.

[4] M. Pignati, L. Zanni, P. Romano, R. Cherkaoui, and M. Paolone, "Fault Detection and Faulted Line Identification in Active Distribution Networks using Synchrophasors-based Real-Time State Estimation," *IEEE Trans. Power Deliv.*, vol. 8977, no. c, pp. 1-1, 2016.

[5] D. Belega and D. Petri, "Sine-wave parameter estimation by interpolated DFT method based on new cosine windows with high interference rejection capability," *Digit. Signal Process.*, vol. 33, pp. 60-70, 2014.

[6] P. Romano and M. Paolone, "Enhanced interpolated-DFT for synchrophasor estimation in FPGAs: Theory, implementation, and validation of a PMU prototype," *IEEE Trans. Instrum. Meas., vol.* 63, no. 12, pp. 2824-2836, 2014.

[7] D. Agrez, "Weighted multipoint interpolated DFT to improve amplitude estimation of multifrequency signal," *IEEE Trans. Instrum. Meas.*, vol. 51, no. 2, pp. 287-292, April 2002.

[8] D. Belega, D. Petri, and D. Dallet, "Frequency estimation of a sinusoidal signal via a three-point interpolated DFT method with high image component interference rejection capability," *Digit. Signal Process., vol.* 24, pp. 162-169, 2014.

[9] D. Belega and D. Petri, "Accuracy Analysis of the Multicycle Synchrophasor Estimator Provided by the Interpolated DFT Algorithm," vol. 62, no. 5, pp. 942-953, 2013.

[10] T. Radii, P. M. Ramos, and A. C. Serra, "New spectrum leakage correction algorithm for frequency estimation of power system signals," *IEEE Trans. Instrum. Meas.*, vol. 58, no. 5, pp. 1670-1679, 2009.

[11] M. Bertocco, G. Frigo, C. Narduzzi, C. Muscas, and P. A. Pegoraro, "Compressive sensing of a Taylor-Fourier multifrequency model for synchrophasor estimation," IEEE Transactions on Instrumentation and Measurement, vol. 64, no. 12, pp. 3274-3283, December 2015.

[12] A. Ferrero, S. Salicone, and S. Toscani, "A Fast, Simplified Frequency-Domain Interpolation Method for the Evaluation of the Frequency and Amplitude of Spectral Components," *IEEE Trans. Instrum. Meas.*, vol. 60, no. 5, pp. 1579-1587, May 2011.

[13] D. Belega, D. Petri, and D. Dallet, "Impact of harmonics on the interpolated DFT frequency estimator," *Mech. Syst. Signal Process.*, vol. 66, pp. 349-360, 2016.

[14] V. K. Jain, W. L. Collins, and D. C. Davis, "High-accuracy analog measurements via interpolated FFT," *Instrum. Meas. IEEE Trans.*, vol. 28, no. 2, pp. 113-122, 1979.

[15] T. Grandke, "Interpolation Algorithms for Discrete Fourier Transforms of Weighted Signals," *Instrum. Meas. IEEE Trans.*, vol. 32, no. 2, pp. 350-355, 1983.

[16] F. J. Harris, "On the Use of Windows for Harmonic Analysis with the Discrete Fourier Transform," vol. 6, no. 1, pp. 51-83, 1978.

[17] K. Duda and S. Barczentewicz, "Interpolated DFT for sinAct Windows," *IEEE Trans. Instrum. Meas.*, vol. 63, no. 4, pp. 754-760, April 2014.

[18] P. Castello, M. Lixia, C. Muscas, and P. A. Pegoraro, "Impact of the Model on the Accuracy of Synchrophasor Measurement," vol. 61, no. 8, pp. 2179-2188, 2012.

[19] P. Romano, "DFT-based Synchrophasor Estimation Algorithms and their Integration in Advanced Phasor Measurement Units for the Real-time Monitoring of Active Distribution Networks," Ph.D. dissertation, STI, Lausanne, 2016.

[20] D. Macii, S. Member, D. Fontanelli, G. Barchi, D. Petri, and A. Next-generation, "Impact of Acquisition Wideband Noise on Synchrophasor Measurements: A Design Perspective," vol. 65, no. 10, pp. 2244-2253, 2016.

[21] "IEEE Standard for Synchrophasor Measurements for Power Systems—Amendment 1: Modification of Selected Performance Requirements," *IEEE Std C*37.118.1a-2014 (*Amendment to IEEE Std C*37.118.1-2011), vol. 2014, pp. 1-25, 2014.

[22] "IEEE Guide for Synchronization, Calibration, Testing, and Installation of Phasor Measurement Units (PMUs) for Power System Protection and Control," *IEEE Std C*37.242-2013, no. March, pp. 1-107, 2013.

The invention claimed is:

1. A method for performing synchrophasor estimation of an input signal for monitoring normal and/or fault conditions of a power network, the input signal being representative of at least one of a voltage and current of a sinusoidal power system of the power network, the method comprising the steps of:
   measuring at least one of a voltage or current signal of the sinusoidal power system to provide for the input signal;
   periodic sampling a continuous time-domain waveform that includes the input signal to obtain a discrete time-domain function;
   transforming the discrete time-domain function to a discrete frequency-domain function to obtain a DFT spectrum;
   estimating from the DFT spectrum instantaneous parameters of a synchrophasor of the sampled continuous time-domain waveform, the instantaneous parameters comprising a frequency, an amplitude and a phase angle of the synchrophasor; and
   using the instantaneous parameters for monitoring normal and/or fault conditions of the power network,
   wherein the step of estimating includes,
   estimating parameters of a main tone of the input signal by processing the DFT spectrum; and
   subtracting the main tone from the DFT spectrum, to obtain a further DFT spectrum that accounts for spurious contribution perturbing a fundamental tone of the input signal;
   wherein the method further comprises the steps of,
   comparing the spectral energy of the further DFT spectrum weighted by the spectral energy of the DFT spectrum to a specific threshold, and
   detecting an interfering tone when the step of comparing reveals that the specific threshold is exceeded, and
     (i) subtracting the main tone from the DFT spectrum, to obtain an estimation of the DFT spectrum of the interfering tone of the input signal,
     (ii) estimating the parameters of the interfering tone of the input signal by processing the interfering tone DFT spectrum,
     (iii) subtracting the interfering tone from the DFT spectrum, to obtain an estimation of the DFT spectrum of the main tone of the input signal,
     (iv) estimating the parameters of the main tone of the input signal by processing the main tone DFT spectrum,
     (v) iterating steps (i) to (iv) a predefined number of times Q, and
     (vi) reporting the parameters of the main tone of the input signal estimated at step (iv); and
   in case the interfering tone is not detected, reporting the estimated parameters of the main tone of the input signal.

2. The method of claim 1, wherein the step of periodic sampling comprises:
   acquiring a time-domain signal corresponding to the continuous time-domain waveform; and
   periodically sampling the time-domain signal with a specific sampling rate $F_s$, to obtain the discrete time-domain function.

3. The method of claim 1, wherein the step of transforming the discrete time-domain function comprises:
   extracting a finite-length portion of the discrete time-domain function, comprising N equally spaced samples;
   applying to the extracted finite-length sequence of N samples a discrete time-domain window function to obtain a windowed signal; and
   applying a discrete time Fourier transform (DFT) to the windowed signal resulting in a frequency-domain function, to obtain the DFT spectrum.

4. The method of claim 1, wherein the processing of the DFT spectrum is performed by enhanced Interpolated DFT (e-IpDFT), and wherein the enhanced Interpolated DFT (e-IpDFT) of the estimating step comprises:
   estimating parameters of the main tone of the input signal by processing the DFT spectrum via the Interpolated DFT (IpDFT);
   subtracting a negative image of the main tone from the DFT spectrum, to obtain the spectrum of the positive image of the main tone;
   estimating the parameters of the main tone of the input signal by processing the spectrum of the positive image of the main tone via the IpDFT;
   iterating the subtracting and estimating steps a predefined number of times P; and
   reporting the parameters of the main tone of the input signal of the estimating step.

5. The method of claim 1, wherein the synchrophasor includes a complex function including an instantaneous frequency, amplitude and phase corresponding to the instantaneous frequency, amplitude and phase of the main tone of the input signal, referred to a common time reference.

6. A system for performing synchrophasor measurements for monitoring normal and fault conditions of an input signal from a power network, the input signal being representative of at least one of a voltage and current of a sinusoidal power system of the power network, the system comprising:
   an input channel to measure and acquire analog signals of at least one of a voltage or current signal of a power system;
   an analog-to-digital-converter device connected to the input channel to convert the analog signals to discrete-time signals; and
   a data processing device operatively coupled to the analog-to-digital-converter device, the data processing device configured to,
     provide a set of N equally spaced samples of the discrete time signals,
     apply a discrete time-domain window function to the set of N equally spaced samples to generate a windowed signal,
     apply a discrete time Fourier transform (DFT) to the windowed signal to generate a DFT spectrum,
     estimate main/interfering tone parameters by processing the DFT spectrum,
     compensate the DFT spectrum for an estimated tone of the main/interfering tone parameters, and
     determine instantaneous frequency, amplitude and phase of the at least one of a voltage or current signal using the estimated main/interfering tone parameters, wherein in the estimating of the main/interfering tone parameters, the data processing device is configured to:
estimating parameters of a main tone of the input signal by processing the DFT spectrum; and
subtracting the main tone from the DFT spectrum, to obtain a further DFT spectrum that accounts for spurious contribution perturbing a fundamental tone of the discrete time signals;
wherein the data processing device is configured to,
compare the spectral energy of the further DFT spectrum weighted by the spectral energy of the DFT spectrum to a specific threshold, and
detect an interfering tone if the step of comparing reveals that the specific threshold is exceeded, and
  (i) subtract the main tone from the DFT spectrum, to obtain an estimation of the DFT spectrum of the interfering tone of the discrete time signals,
  (ii) estimate the parameters of the interfering tone of the discrete time signals by processing the interfering tone DFT spectrum,
  (iii) subtract the interfering tone from the DFT spectrum, to obtain an estimation of the DFT spectrum of the main tone of the discrete time signals,
  (iv) estimate the parameters of the main tone of the discrete time signals by processing the main tone DFT spectrum,
  (v) iterate steps (i) to (iv) a predefined number of times Q, and
  (vi) report the parameters of the main tone of the discrete time signals estimated at step (iv); and
in case the interfering tone is not detected, report the estimated parameters of the main tone of the discrete time signals.

7. The system of claim 6, wherein the processing of the DFT spectrum is performed by enhanced Interpolated DFT (e-IpDFT), and
wherein for the enhanced Interpolated DFT (e-IpDFT) of the estimating the parameters of the main tone, the data processing device is configured to:
estimate parameters of the main tone of the discrete time signals by processing the DFT spectrum via the Interpolated DFT (IpDFT);
subtract a negative image of the main tone from the DFT spectrum, to obtain the spectrum of the positive image of the main tone;
estimate the parameters of the main tone of the discrete time signals by processing the spectrum of the positive image of the main tone via the IpDFT;
iterate the subtraction and the estimation a predefined number of times P; and
report the parameters of the main tone of the discrete time signals of the estimating.

8. A non-transitory computer readable medium having computer instructions recorded thereon, the computer instructions configured to perform a method for performing synchrophasor estimation of an input signal for monitoring normal and/or fault conditions of a power network, the input signal being representative of at least one of a voltage and current of a sinusoidal power system, the method comprising the steps of:
measuring at least one of a voltage or current signal of the sinusoidal power system to provide for the input signal;
periodic sampling a continuous time-domain waveform that includes the input signal to obtain a discrete time-domain function;
transforming the discrete time-domain function to a discrete frequency-domain function to obtain a DFT spectrum;
estimating from the discrete frequency-domain function instantaneous parameters of a synchrophasor of the sampled continuous time-domain waveform, the instantaneous parameters comprising a frequency, an amplitude and a phase angle of the synchrophasor; and
using the instantaneous parameters for monitoring normal and/or fault conditions of the power network,
wherein the step of estimating includes,
estimating parameters of a main tone of the input signal by processing the DFT spectrum; and
subtracting the main tone from the DFT spectrum, to obtain a further DFT spectrum that accounts for spurious contribution perturbing a fundamental tone of the input signal;
wherein the method further comprises the steps of,
comparing the spectral energy of the further DFT spectrum weighted by the spectral energy of the DFT spectrum to a specific threshold, and
detecting an interfering tone when the step of comparing reveals that the specific threshold is exceeded, and
  (i) subtracting the main tone from the DFT spectrum, to obtain an estimation of the DFT spectrum of the interfering tone of the input signal,
  (ii) estimating the parameters of the interfering tone of the input signal by processing the interfering tone DFT spectrum,
  (iii) subtracting the interfering tone from the DFT spectrum, to obtain an estimation of the DFT spectrum of the main tone of the input signal,
  (iv) estimating the parameters of the main tone of the input signal by processing the main tone DFT spectrum,
  (v) iterating steps (i) to (iv) a predefined number of times Q, and
  (vi) reporting the parameters of the main tone of the input signal estimated at step (iv); and
in case the interfering tone is not detected, reporting the estimated parameters of the main tone of the input signal.

9. The non-transitory computer readable medium of claim 8, wherein the step of periodic sampling comprises:
acquiring a time-domain signal corresponding to the continuous time-domain waveform;
periodically sampling the time-domain signal with a specific sampling rate $F_s$, to obtain the discrete time-domain function.

10. The non-transitory computer readable medium of claim 8, wherein the step of transforming the discrete time-domain function comprises:
extracting a finite-length portion of the discrete time-domain function, comprising N equally spaced samples;
applying to the extracted finite-length sequence of N samples a discrete time-domain window function to obtain a windowed signal; and
applying a discrete time Fourier transform (DFT) to the windowed signal resulting in a frequency-domain function, to obtain the DFT spectrum.

11. The non-transitory computer readable medium of claim 8, wherein the processing of the DFT spectrum is performed by enhanced Interpolated DFT (e-lpDFT), and wherein the enhanced Interpolated DFT (e-lpDFT) of the estimating step comprises:

estimating parameters of the main tone of the input signal by processing the DFT spectrum via the Interpolated DFT (IpDFT);

subtracting a negative image of the main tone from the DFT spectrum, to obtain the spectrum of the positive image of the main tone;

estimating the parameters of the main tone of the input signal by processing the spectrum of the positive image of the main tone via the IpDFT;

iterating the subtracting and estimating steps a predefined number of times P; and reporting the parameters of the main tone of the input signal of the estimating step.

\* \* \* \* \*